(12) United States Patent
Choi et al.

(10) Patent No.: US 11,064,608 B2
(45) Date of Patent: Jul. 13, 2021

(54) DISPLAY DEVICE

(71) Applicant: LG Display Co., Ltd., Seoul (KR)

(72) Inventors: Jaekyung Choi, Goyang-si (KR); ChounSung Kang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 29 days.

(21) Appl. No.: 16/667,636

(22) Filed: Oct. 29, 2019

(65) Prior Publication Data

US 2020/0170114 A1      May 28, 2020

(30) Foreign Application Priority Data

Nov. 28, 2018   (KR) .......................... 10-2018-0149910

(51) Int. Cl.
| | |
|---|---|
| *H05K 1/00* | (2006.01) |
| *H05K 1/02* | (2006.01) |
| *H05K 1/11* | (2006.01) |
| *H05K 1/14* | (2006.01) |
| *H05K 1/18* | (2006.01) |
| *H05K 5/00* | (2006.01) |
| *H05K 5/02* | (2006.01) |
| *H05K 5/03* | (2006.01) |
| *G02F 1/1333* | (2006.01) |
| *G06F 1/16* | (2006.01) |

(Continued)

(52) U.S. Cl.
CPC .............. *H05K 1/147* (2013.01); *H05K 1/189* (2013.01); *H05K 5/0017* (2013.01); *H05K 5/0217* (2013.01); *H05K 2201/09018* (2013.01); *H05K 2201/10128* (2013.01)

(58) Field of Classification Search
CPC ... H05K 1/00; H05K 1/02; H05K 1/11; H05K 1/14; H05K 1/18; H05K 5/00; H05K 5/02; H05K 5/03; G02F 1/1333; G06F 1/16; G06F 3/041; G06F 3/147; G09F 9/00; G09F 9/30; G09G 3/20; G09G 3/22; G09G 3/3233; H01L 51/00; H01L 51/50; H01L 51/52
USPC ......... 361/749; 345/55, 204; 349/58; 40/515
See application file for complete search history.

(56) References Cited

U.S. PATENT DOCUMENTS 9,098,241 B1 *  8/2015  Cho .................... B65H 75/4402
9,629,237 B2     4/2017  Cho et al.
(Continued)

FOREIGN PATENT DOCUMENTS

| CN | 105280668 A | 1/2016 |
|---|---|---|
| CN | 106409147 A | 2/2017 |

(Continued)

OTHER PUBLICATIONS

China National Intellectual Property Administration, Office Action, CN Patent Application No. 201910993529.0, dated May 31, 2021, 15 pages.

*Primary Examiner* — Xiaoliang Chen
(74) *Attorney, Agent, or Firm* — Fenwick & West LLP

(57) ABSTRACT

A rollable display device is disclosed. The rollable display device includes a rollable display panel, a roller configured to roll and unroll the rollable display pane, and a first printed circuit board electrically connected to the rollable display panel. The first printed circuit board comprises a curved surface having a curvature that matches a curvature of a curved surface of the roller. The first curved surface of the printed circuit board is in contact with the curved surface of the roller.

18 Claims, 19 Drawing Sheets

(51) Int. Cl.
*G06F 3/041* (2006.01)
*G06F 3/147* (2006.01)
*G09F 9/00* (2006.01)
*G09F 9/30* (2006.01)
*G09G 3/20* (2006.01)
*G09G 3/22* (2006.01)
*G09G 3/3233* (2016.01)
*H01L 51/00* (2006.01)
*H01L 51/50* (2006.01)
*H01L 51/52* (2006.01)

(56) References Cited

U.S. PATENT DOCUMENTS

| | | | |
|---|---|---|---|
| 9,684,340 | B2 | 6/2017 | Han et al. |
| 9,788,440 | B2 | 10/2017 | Cho et al. |
| 10,153,337 | B2 | 12/2018 | Lee et al. |
| 10,362,689 | B2 | 7/2019 | Cho et al. |
| 10,418,425 | B2 | 9/2019 | Park et al. |
| 10,534,402 | B1* | 1/2020 | Kim .................. H05K 5/0217 |
| 10,651,246 | B2 | 5/2020 | Park et al. |
| 10,701,813 | B2 | 6/2020 | Kim et al. |
| 11,018,205 | B2 | 5/2021 | Park et al. |
| 2006/0007368 | A1* | 1/2006 | Slikkerveer ............ G09F 11/29 349/58 |
| 2006/0107566 | A1* | 5/2006 | Van Rens ............... G09F 9/35 40/515 |
| 2009/0267870 | A1* | 10/2009 | Schellingerhout ........................ G02F 1/133305 345/55 |
| 2013/0127799 | A1* | 5/2013 | Lee ...................... G06F 1/1652 345/204 |
| 2013/0257696 | A1 | 10/2013 | Ha et al. |
| 2014/0240933 | A1 | 8/2014 | Lee et al. |
| 2016/0029474 | A1* | 1/2016 | Cho .................... H05K 5/0217 361/749 |
| 2016/0231843 | A1* | 8/2016 | Kim .................... G06F 3/0412 |
| 2016/0320804 | A1* | 11/2016 | Takayanagi ........... G06F 1/1679 |
| 2017/0031388 | A1* | 2/2017 | Han .................... G09G 3/3233 |
| 2017/0071066 | A1* | 3/2017 | Cho .................... B65H 75/28 |
| 2017/0196103 | A1* | 7/2017 | Cho .................... H01L 51/5237 |
| 2017/0318688 | A1* | 11/2017 | Kim .................... G06F 1/1652 |
| 2017/0318693 | A1 | 11/2017 | Kim et al. |
| 2017/0367198 | A1* | 12/2017 | Park .................... H01L 51/5237 |
| 2018/0014415 | A1* | 1/2018 | Choi ................... H05K 5/0247 |
| 2018/0014417 | A1* | 1/2018 | Seo .................... H05K 1/189 |
| 2018/0040672 | A1 | 2/2018 | Park et al. |
| 2018/0098440 | A1* | 4/2018 | Choi ................... G06F 1/1652 |
| 2018/0102072 | A1 | 4/2018 | Lee .................... G06F 3/147 |
| 2018/0103550 | A1* | 4/2018 | Seo .................... H04N 5/64 |
| 2018/0103551 | A1* | 4/2018 | Park ................... G06F 1/1652 |
| 2018/0114471 | A1* | 4/2018 | Park ................... G09F 9/301 |
| 2018/0182839 | A1 | 6/2018 | Lee et al. |
| 2018/0341142 | A1* | 11/2018 | Choi ................... G06F 1/1643 |
| 2019/0036067 | A1* | 1/2019 | Kim .................... H05K 5/0069 |
| 2019/0064578 | A1* | 2/2019 | Cho .................... H01L 51/5237 |
| 2019/0098776 | A1* | 3/2019 | Jeon ................... G09F 9/301 |
| 2019/0138058 | A1* | 5/2019 | Kwon .................. G09G 3/22 |
| 2019/0393274 | A1 | 12/2019 | Park et al. |
| 2020/0273922 | A1 | 8/2020 | Park et al. |

FOREIGN PATENT DOCUMENTS

| | | |
|---|---|---|
| CN | 107369382 A | 11/2017 |
| CN | 107680984 A | 2/2018 |
| CN | 108257508 A | 7/2018 |
| KR | 10-2016-0011718 A | 2/2016 |
| KR | 10-2017-0093394 A | 8/2017 |

* cited by examiner

DISPLAY DEVICE

CROSS-REFERENCE TO RELATED APPLICATIONS

This application claims the priority of Republic of Korea Patent Application No. 10-2018-0149910 filed on Nov. 28, 2018, in the Korean Intellectual Property Office, the disclosure of which is incorporated by reference in its entirety.

BACKGROUND

Field

The present disclosure relates to a display device, and more particularly, to a rollable display device which is capable of reducing a size of a roller.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display unit and a wiring line on a flexible substrate such as plastic which is a flexible material so as to be capable of displaying images even though the display device is rolled is getting attention as a next generation display device.

SUMMARY

An object to be achieved by the present disclosure is to provide a display device which is capable of reducing a size of a roller even though a control printed circuit board is disposed in the roller.

Another object to be achieved by the present disclosure is to provide a display device which is capable of increasing a surface area of a control printed circuit board.

Still another object to be achieved by the present disclosure is to provide a display device in which a control printed circuit board is configured by a roller.

Still another object to be achieved by the present disclosure is to provide a display device in which a control printed circuit board is fastened onto an outer circumferential surface of a roller to improve a heat radiation effect of the control printed circuit board.

Objects of the present disclosure are not limited to the above-mentioned objects, and other objects, which are not mentioned above, can be clearly understood by those skilled in the art from the following descriptions.

Other detailed matters of the exemplary embodiments are included in the detailed description and the drawings.

According to the present disclosure, a surface area of the control printed circuit board disposed in the roller is increased, but the size of the roller may be reduced.

According to the present disclosure, the roller and the control printed circuit board are fastened with each other to effectively radiate heat generated in the control printed circuit board.

In one embodiment, a rollable display device comprises: a rollable display panel including a plurality of pixels; a roller comprising an outer surface and an inner surface, the roller configured to roll the rollable display panel around the outer surface of the roller into a rolled state, and unroll the rollable display panel from the rolled state to an unrolled state; and a first printed circuit board electrically connected to the rollable display panel, wherein the first printed circuit board comprises a first curved surface having a curvature that matches a curvature of a curved surface of the roller, wherein the first curved surface of the printed circuit board is in contact with the curved surface of the roller.

In one embodiment, a display device comprises: a rollable display panel in which a plurality of pixels are defined; a control printed circuit board; and a roller configured to wind and unwind the rollable display panel from the roller; wherein at least a portion of the control printed circuit board has a shape corresponding to a curved surface of the roller.

In one embodiment, a display device comprises: a display panel configured to display images; a roller configured to winding and unwind the display panel from the roller; a first printed circuit board electrically connected to the display panel; an integrated circuit (IC) chip disposed on an inner surface of the first printed circuit board; and wherein at least a portion of an outer surface of the first printed circuit board has a shape corresponding to a curved surface of the roller.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
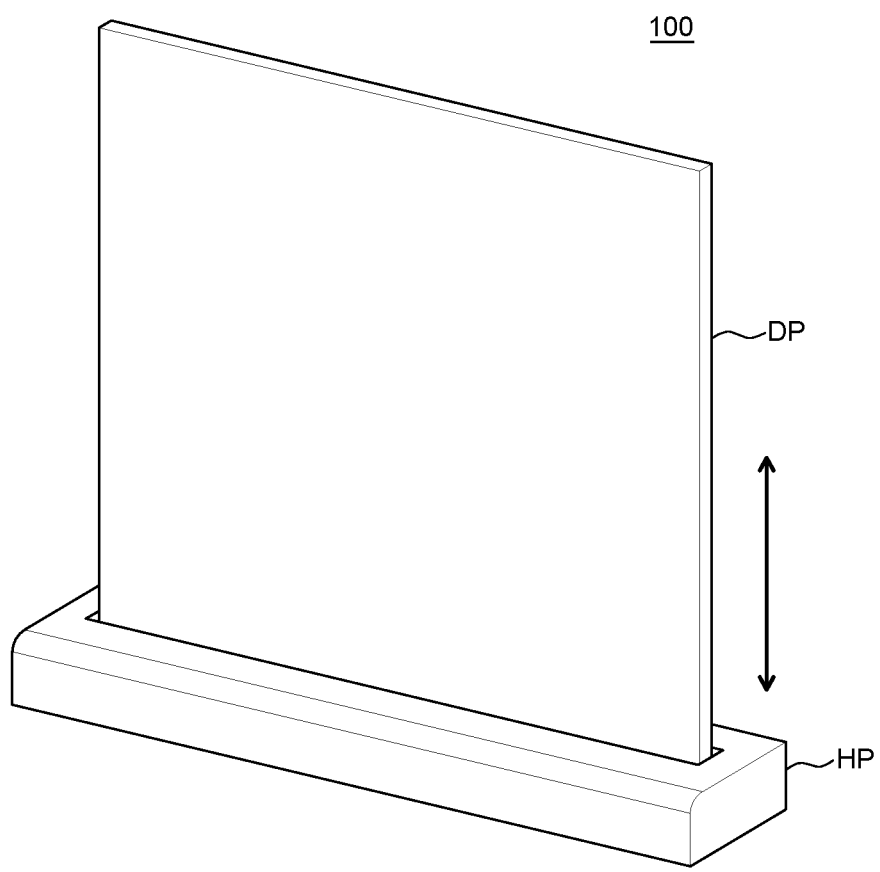
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

<Display Device—Rollable Display Device>

First, a rollable display device may also be referred to as a display device which is capable of displaying images even though the display device is rolled. The rollable display device may have high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unfolded to be used.

Figure 1B:
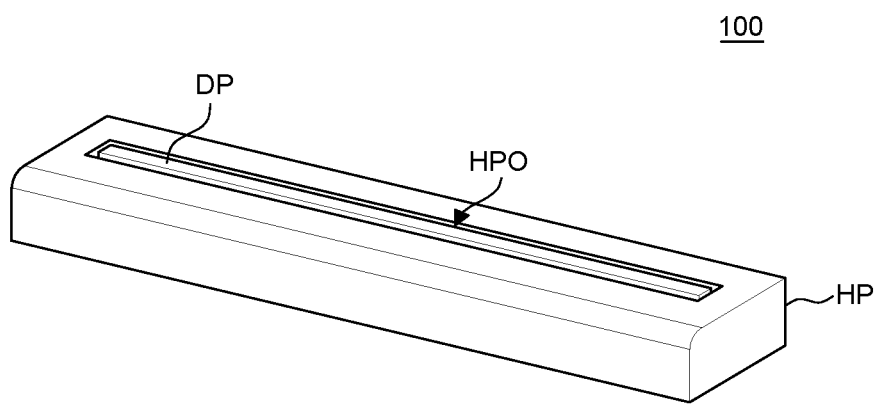

FIGS. 1A and 1B are perspective views of a display device according to an exemplary embodiment of the present disclosure. Referring to FIGS. 1A and 1B, a display device 100 according to an exemplary embodiment of the present disclosure includes a display unit DP and a housing unit HP.

The display unit DP is a configuration for displaying images to a user and for example, in the display unit, a display element and a circuit, a wiring line, and a component for driving the display element may be disposed. In this case, since the display device 100 according to an exemplary embodiment of the present disclosure is a rollable display device 100, the display unit DP may be configured to be wound and unwound. For example, the display unit DP may be formed of a display panel and a back cover each having flexibility to be wound or unwound. The display unit DP will be described below in more detail with reference to FIGS. 5 to 7B.

The housing unit HP is a case in which the display unit DP is accommodated. The display unit DP may be wound to be accommodated in the housing unit HP and the display unit DP may be unwound to be disposed outside of the housing unit HP.

The housing unit HP may have an opening HPO to allow the display unit DP to be rolled into the housing unit HP and out of the housing unit HP. The display unit DP may move in a vertical direction through the opening HPO of the housing unit HP.

In the meantime, the display unit DP of the display device 100 may be switched from a fully unwound state to a fully wound state or from a fully wound state to a fully unwound state.

FIG. 1A illustrates the display unit DP of the display device 100 which is fully unwound and in the fully unwound state, the display unit DP of the display device 100 is disposed outside of the housing unit HP. That is, in order for a user to watch images through the display device 100, when the display unit DP is unwound to be disposed outside of the housing unit HP as much as possible and cannot be further unwound anymore, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In the meantime, in order to switch the display unit DP to a fully unwound state or a fully wound state, a driving unit which winds or unwinds the display unit DP is disposed.

<Driving Unit>

Figure 2:
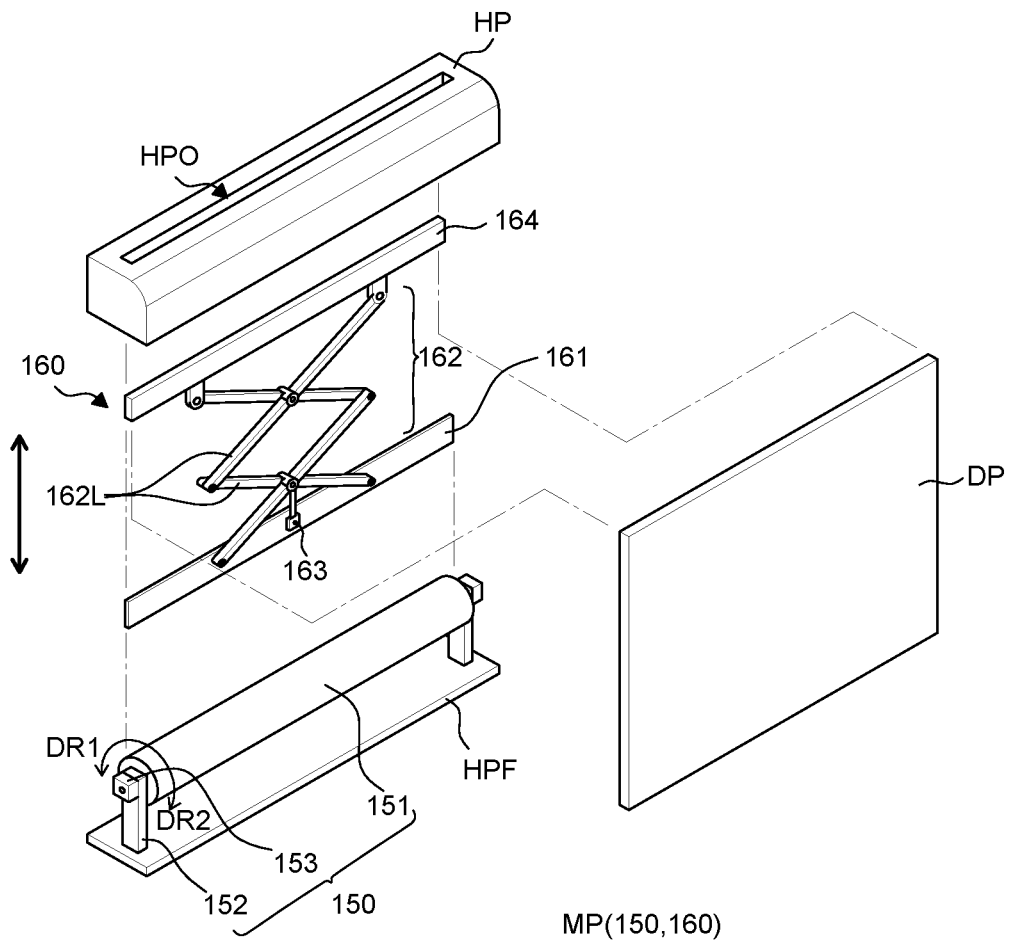
FIG. 2 is an exploded perspective view of a display device according to an exemplary embodiment of the present disclosure.
Figure 3:
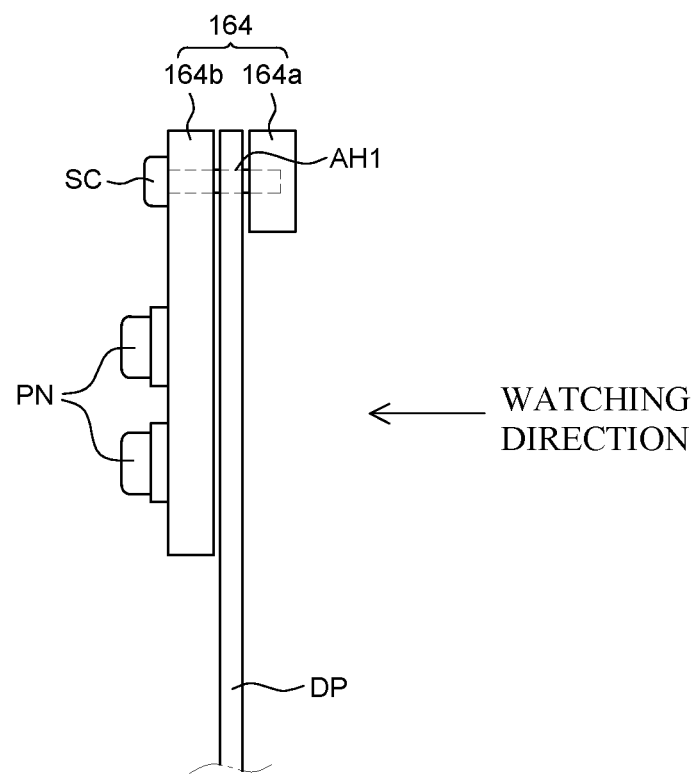
FIG. 3 is a schematic cross-sectional view for explaining a head bar and a display unit of a display device according to an exemplary embodiment of the present disclosure.
Figure 4:
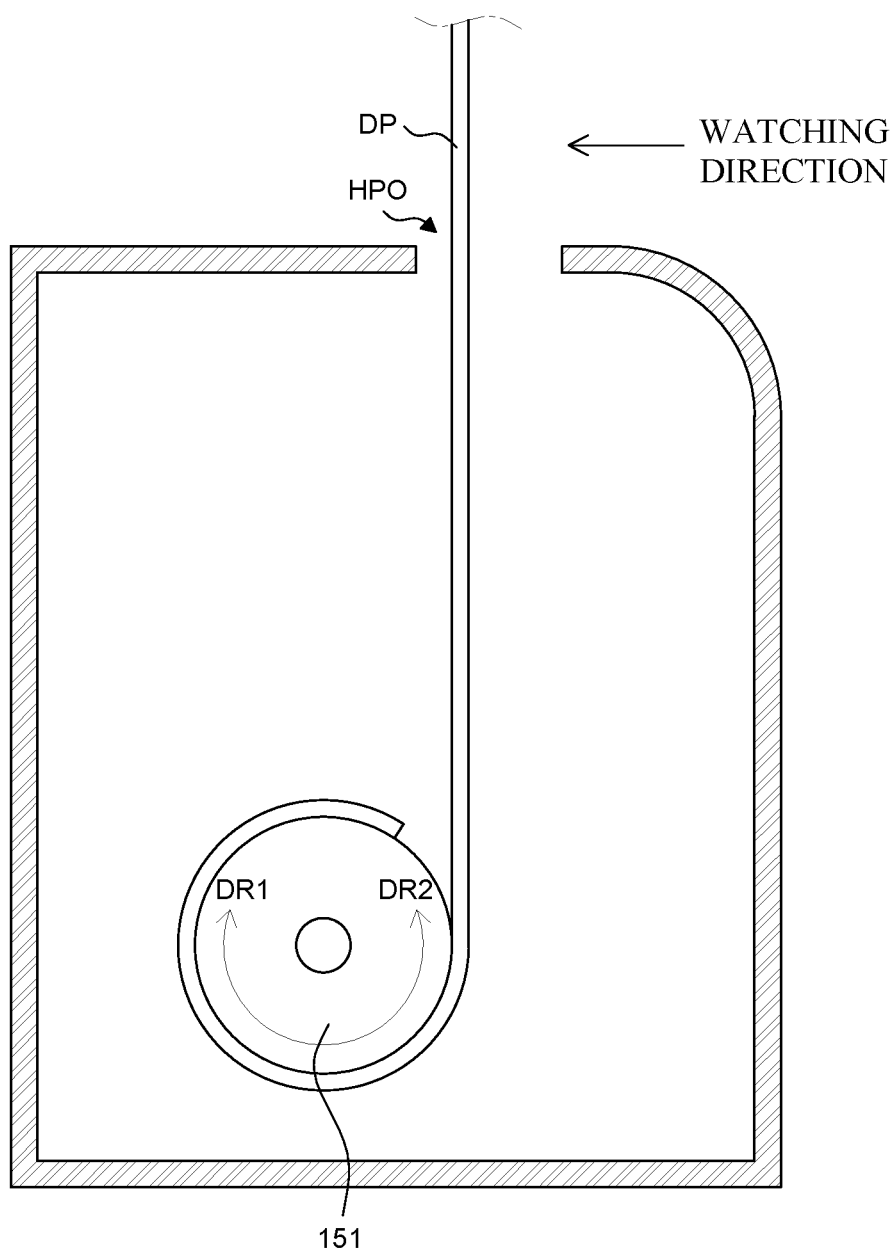
FIG. 4 is a cross-sectional view of a display device according to an exemplary embodiment of the present disclosure.

FIG. 2 is an exploded perspective view of a display device according to an exemplary embodiment of the present disclosure. FIG. 3 is a schematic cross-sectional view for explaining a head bar and a display unit of a display device according to an exemplary embodiment of the present disclosure. FIG. 4 is a cross-sectional view of a display device according to an exemplary embodiment of the present disclosure. FIG. 4 is a schematic cross-sectional view for explaining a roller 151 and a display unit DP of a display device 100 according to an exemplary embodiment of the present disclosure. For the convenience of description, FIG. 3 illustrates only a head bar 164 and a display unit DP and FIG. 4 illustrates only a housing unit HP, a roller 151, and a display unit DP.

First, referring to FIG. 2, a driving unit MP includes a roller unit 150 and a lifting unit 160.

The roller unit 150 winds or unwinds the display unit DP fixed to the roller unit 150 while rotating in a first direction DR1 or a second direction DR2. The roller unit 150 includes a roller 151, a roller support unit 152, and a roller rotating unit 153.

The roller 151 is a member around which the display unit DP is wound. The roller 151 may be, for example, formed to have a cylindrical shape. A lower edge of the display unit DP may be fixed to the roller 151. When the roller 151 rotates, the display unit DP which is fixed to the roller 151 through the lower edge may be wound around the roller 151. In contrast, when the roller 151 rotates in an opposite direction, the display unit DP which is wound around the roller 151 may be unwound from the roller 151. The roller 151 may be formed of a metal material or a plastic material having rigidity.

The roller support units 152 support the roller 151 at both sides of the roller 151. Specifically, the roller support units 152 are disposed on a bottom surface HPF of the housing unit HP. Upper side surfaces of the roller support units 152 are coupled to both ends of the roller 151. Therefore, the roller support units 152 may support the roller 151 to be spaced apart from the bottom surface HPF of the housing unit HP. In this case, the roller 151 may be rotatably coupled to the roller support units 152.

The roller rotating units 153 may rotate the roller 151 in the first direction DR1 or the second direction DR2. Roller rotating units 153 may be disposed in a pair of roller support units 152. For example, the roller rotating units 153 may be rotary motors which transmit a torque to the roller 151, but are not limited thereto.

The lifting unit 160 moves the display unit DP in a vertical direction in accordance with the driving of the roller unit 150. The lifting unit 160 includes a link support unit 161, a link unit 162, a link lifting unit 163, and a head bar 164.

The link support unit 161 supports the link unit 162 and the link lifting unit 163. Specifically, the link support unit 161 may support the link unit 162 and the display unit DP which move in the vertical direction so as not to collide with a boundary of the opening HPO of the housing unit HP. The link support unit 161 may support the link unit 162 and the display unit DP to move only in a vertical direction without moving in forward and backward directions.

The link unit 162 may include a plurality of links 162L which is hinged with each other. The plurality of links 162L are rotatably hinged to each other to move in the vertical direction by the link lifting unit 163. When the link unit 162 moves in the vertical direction, the plurality of links 162L rotates to be as far away from each other as possible or as close to each other as possible. A detailed description thereof will be made with reference to FIG. 4.

The link lifting unit 163 moves the link unit 162 in the vertical direction. The link lifting unit 163 rotates the plurality of links 162L of the link unit 162 to be as close to each other as possible or rotates the plurality of links 162L to be as far away from each other as possible. The link lifting unit 163 lifts or lowers the link unit 162 to lift or lower the display unit DP connected to the link unit 162.

In this case, the link lifting unit 163 is driven to be synchronized with the roller rotating unit 153 so that the roller unit 150 and the lifting unit 160 may simultaneously operate. For example, when the display unit DP is switched from a fully unwound state to a fully wound state, the roller unit 150 operates to wind the display unit DP around the roller 151 and simultaneously with this, the lifting unit 160 operates to rotate the plurality of links 162L of the link unit 162 to lower the display unit DP. Further, when the display unit DP is switched from a fully wound state to a fully unwound state, the roller unit 150 operates to unwind the display unit DP from the roller 151 and simultaneously with this, the lifting unit 160 operates to rotate the plurality of links 162L of the link unit 162 to lift the display unit DP.

The head bar 164 of the lifting unit 160 is fixed to an uppermost end (e.g., topmost end) of the display unit DP. The head bar 164 is coupled to the link unit 162 to move the display unit DP in the vertical direction in accordance with the rotation of the plurality of links 162L of the link unit 162. That is, the display unit DP may move in a vertical direction by the head bar 164, the link unit 162, and the link lifting unit 163.

Referring to FIG. 3, the head bar 164 is disposed at the uppermost end of the display unit DP so as to enclose a front surface and a rear surface of the display unit DP.

The head bar 164 includes a first head bar 164a and a second head bar 164b. The first head bar 164a covers the front surface of the display unit DP. The first head bar 164a covers only a portion of the front surface which is adjacent to an uppermost edge of the display unit DP so as not to block an image displayed on the front surface of the display unit DP.

The second head bar 164b covers the rear surface of the display unit DP. The second head bar 164b covers a portion of the rear surface which is adjacent to the uppermost edge of the display unit DP. However, since no image is displayed on the rear surface of the display unit DP, the second head bar 164b may overlap the display unit DP more than the first head bar 164a.

In order to fasten the display unit DP with the first head bar 164a and the second head bar 164b, a first fastening hole AH1 may be formed in the display unit DP. A screw SC penetrates the first fastening hole AH1 to fasten the first head bar 164a, the display unit DP, and the second head bar 164b.

Nuts PN (e.g., swage nuts such as PEM nuts) to which the link unit 162 of the lifting unit 160 is fastened are disposed in the second head bar 164b. The second head bar 164b and the link unit 162 of the lifting unit 160 may be fastened with each other by the nuts PN. Therefore, when the link unit 162 of the lifting unit 160 moves in the vertical direction, the second head bar 164b fastened with the link unit 162 and the first head bar 164a and the display unit DP fastened with the second head bar 164b move together in the vertical direction.

Even though in FIG. 3, it is illustrated that the first head bar 164a and the second head bar 164b have a linear shape, the shapes of the first head bar 164a and the second head bar 164b may be changed in various forms and are not limited thereto.

Hereinafter, a driving operation of the driving unit MP will be described in detail with reference to FIG. 4 together.

Referring to FIG. 4 together, a lower edge of the display unit DP is coupled to the roller 151. When the roller 151 rotates in the first direction DR1, that is, a clockwise direction, by the roller rotating unit 153, the display unit DP may be wound around the roller 151 so that a rear surface of the display unit DP is in close contact with a surface of the roller 151.

In contrast, when the roller 151 rotates in the second direction DR2, that is, a counterclockwise direction, by the roller rotating unit 153, the display unit DP wound around the roller 151 is unwound from the roller 151 to be disposed at the outside of the housing unit HP.

In some exemplary embodiments, a driving unit MP having a different structure other than the above-described driving unit MP may be applied to the display device 100. That is, as long as the display unit DP can be wound and unwound, the above-described configuration of the roller unit 150 and the lifting unit 160 may be modified, some configurations may be omitted, or another configuration may be added.

<Display Unit>

Figure 5:
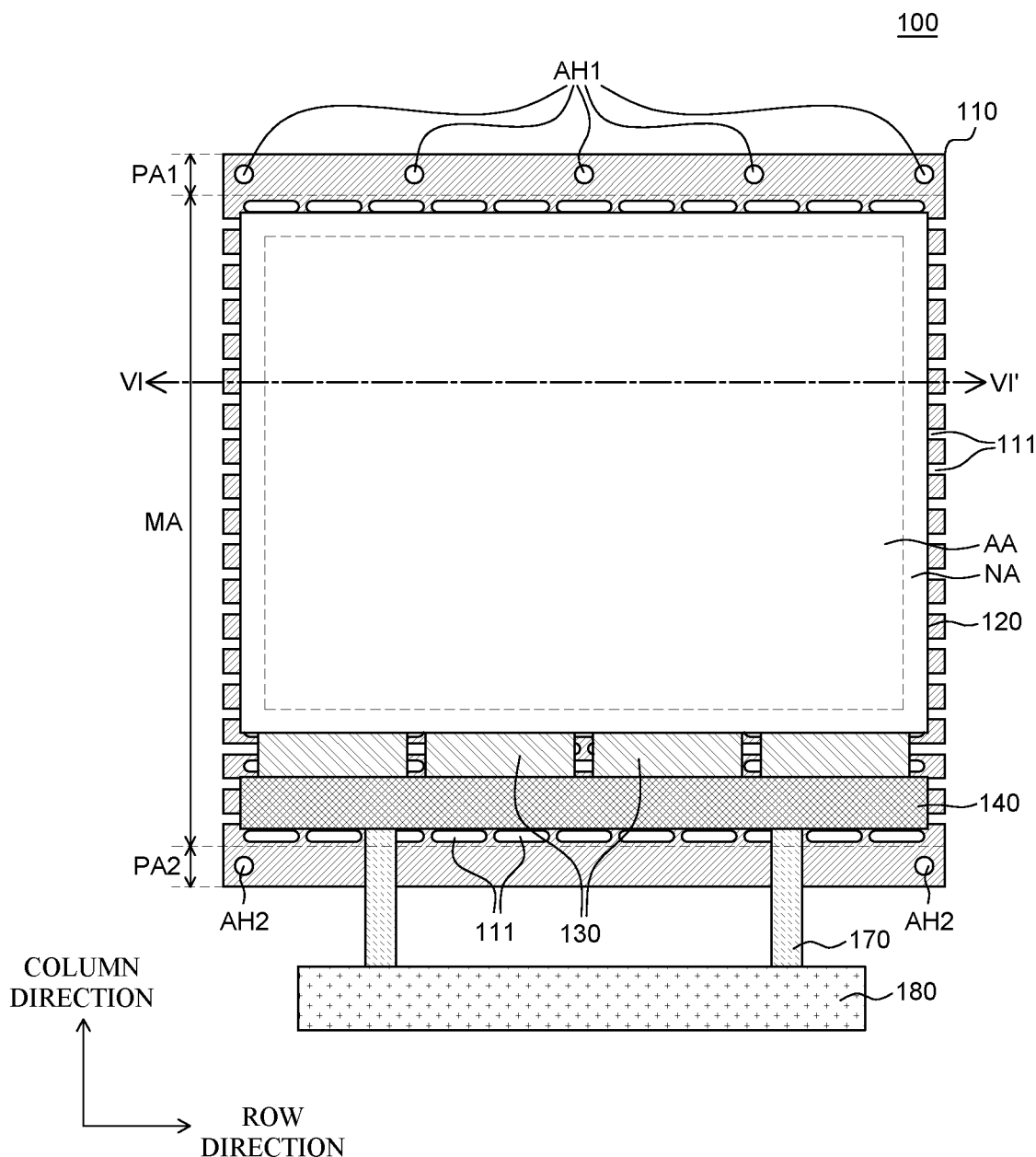
FIG. 5 is a plan view of a display unit of a display device according to an exemplary embodiment of the present disclosure.
Figure 6:
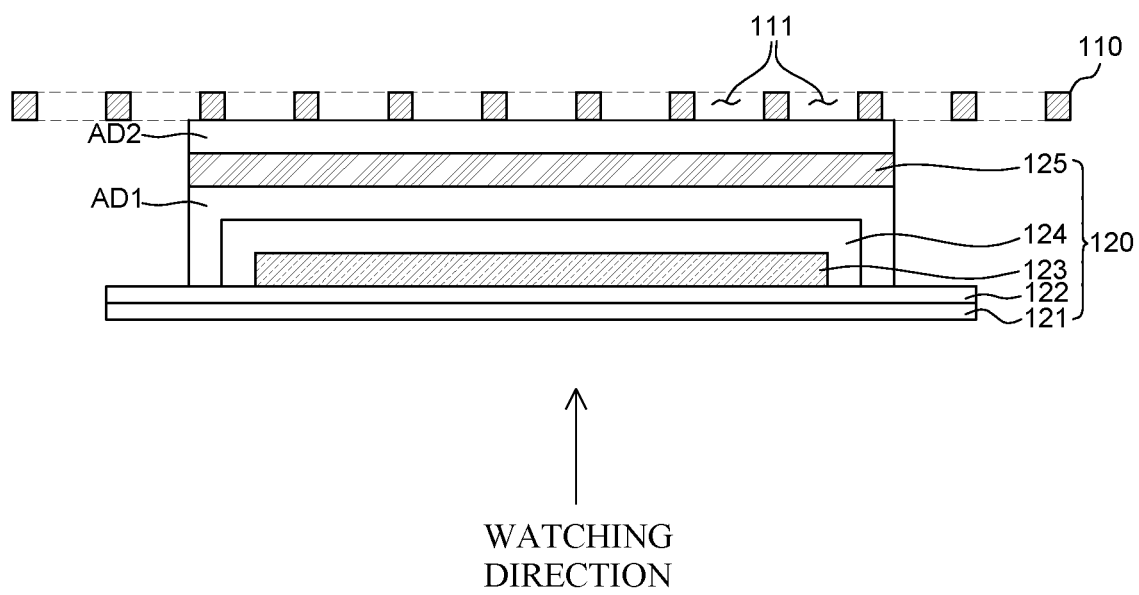
FIG. 6 is a cross-sectional view taken along the line VI-VI' of FIG. 5 according to an exemplary embodiment of the present disclosure.

FIG. 5 is a plan view of a display unit of a display device according to an exemplary embodiment of the present disclosure. FIG. 6 is a cross-sectional view taken along the line VI-VI' of FIG. 5 according to an exemplary embodiment of the present disclosure. In FIG. 5, for the convenience of description, the roller unit 150 and the lifting unit 160 are not illustrated.

Referring to FIG. 5, the display unit DP includes a back cover 110, a display panel 120, a flexible film 130, a source printed circuit board 140, a flexible cable 170, and a control printed circuit board 180.

The display panel 120 is a panel for displaying images to a user. The display panel 120 may include a display element which displays images, a driving element which drives the display element, and wiring lines which transmit various signals to the display element and the driving element. The display element may be defined in different ways depending on a type of the display panel 120. For example, when the display panel 120 is an organic light emitting display panel, the display panel may be an organic light emitting diode which includes an anode, an organic light emitting layer, and a cathode. For example, when the display panel 120 is a liquid crystal display panel, the display panel may be a liquid crystal display element. Hereinafter, even though the display panel 120 is assumed as an organic light emitting display panel, the display panel 120 is not limited to the organic light emitting display panel. Further, since the display device 100 according to an exemplary embodiment of the present disclosure is a rollable display device, the display panel 120 may be implemented as a flexible display panel to be wound around or unwound from the roller 151.

The display panel 120 includes a display area AA and a non-display area NA.

The display area AA is an area where images are displayed in the display panel 120. In the display area AA, a plurality of sub pixels and a circuit for driving the plurality of sub pixels may be disposed. The plurality of sub pixels is minimum units which configure the display area AA and a display element may be disposed in each of the plurality of sub pixels. The plurality of sub pixels may configure a pixel. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be formed of a thin film transistor, a storage capacitor, a gate line, and a data line, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and circuits of the display area AA or a driving IC such as a gate driver IC or a data driver IC may be disposed, but the non-display area is not limited thereto.

The flexible film 130 is a film in which various components are disposed on a base film having malleability. Specifically, the flexible film 130 is a film which supplies a signal to the plurality of sub pixels and the circuits of the display area AA and is electrically connected to the display panel 120. The flexible film 130 is disposed at one end of the non-display area NA of the display panel 120 to supply a power voltage or a data voltage to the plurality of sub pixels and the circuits of the display area AA. Even though four flexible films 130 are illustrated in FIG. 5, the number of flexible films 130 may vary depending on the design and is not limited thereto.

In the meantime, for example, a driving IC such as a gate driver IC or a data driver IC may be disposed on the flexible film 130. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the flexible film 130 by a chip on film technique, but is not limited thereto.

The source printed circuit board 140 is disposed at one end of the flexible film 130 to be connected to the flexible film 130. The source printed circuit board 140 is a component which supplies signals to the driving IC. The source printed circuit board 140 supplies various signals such as a driving signal or a data signal to the driving IC. For example, a data driver which generates data signals may be mounted in the source printed circuit board 140 and the generated data signal may be supplied to the plurality of sub pixels and the circuit of the display panel 120 through the flexible film 130. In the meantime, even though one source printed circuit board 140 is illustrated in FIG. 5, the number of source printed circuit boards 140 may vary depending on the design and is not limited thereto.

A flexible cable 170 which is electrically connected to one end of the source printed circuit board 140 is disposed. Specifically, the source printed circuit board 140 is connected to one end of the flexible cable 170 and the control printed circuit board 180 is disposed to the other end so that the source printed circuit board 140 and the control printed circuit board 180 are electrically connected. The flexible cable 170 may be, for example, a flexible flat cable (FFC), but is not limited thereto.

The control printed circuit board 180 is disposed at the other end of the flexible cable 170. Specifically, the control printed circuit board 180 may be electrically connected to the source printed circuit board 140 through the flexible cable 170. For example, the control printed circuit board 180 may supply a timing signal or a power signal for controlling the driving IC, such as a gate driver IC or a data driver IC, to the driving IC. For example, in the control printed circuit board 180, IC chips, such as a timing controller or a power controller, which generate a gate control signal such as a gate start pulse, a gate shift clock, or a gate output enable signal and a data control signal such as a source start pulse, a source sampling clock, or a source output enable signal may be mounted. The IC chips mounted in the control printed circuit board 180 will be described in detail with reference to FIG. 8.

The back cover 110 is disposed on rear surfaces of the display panel 120, the flexible film 130, and the source printed circuit board 140 to support the display panel 120, the flexible film 130, and the source printed circuit board 140. Therefore, a size of the back cover 110 may be larger than a size of the display panel 120. Therefore, the back cover 110 may protect other configurations of the display unit DP from the outside. Even though the back cover 110 is formed of a material having rigidity, at least a portion of the back cover 110 may have flexibility to be wound or unwound together with the display panel 120. For example, the back cover 110 may be formed of a metal material such as steel use stainless or invar or plastic. However, if the material of the back cover 110 satisfies physical conditions such as a thermal strain amount, a radius of curvature, and rigidity, the material may be diversely changed, and is not limited thereto.

Referring to FIG. 6, the display panel 120 includes a substrate 121, a buffer layer 122, a pixel unit 123, an encapsulation layer 124, and an encapsulation substrate 125.

The substrate 121 which is a base member for supporting various components of the display panel 120 may be configured by an insulating material. The substrate 121 may be formed of a material having flexibility to allow the display panel 120 to be wound or unwound and for example, may be formed of a plastic material such as polyimide PI.

The buffer layer 122 suppresses moisture and/or oxygen which is permeated from the outside of the substrate 121 from being diffused. The buffer layer 122 may be configured by a single layer or a double layer of silicon oxide SiOx and silicon nitride SiNx, but is not limited thereto.

The pixel unit 123 includes a plurality of organic light emitting diodes and a circuit for driving the plurality of organic light emitting diodes. The pixel unit 123 may be an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), or indium zinc tin oxide (ITZO), but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. In this case, when the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from a group consisting of metals such as magnesium (Mg), silver (Ag), and aluminum (Al), and an alloy thereof, but is not limited thereto.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having high reflectivity.

Hereinafter, for the convenience of description, the description will be made by assuming that the display device 100 according to an exemplary embodiment of the present disclosure is a bottom emission type display device, but it is not limited thereto.

A circuit for driving the organic light emitting diode is disposed in the pixel unit 123. The circuit may be formed of a thin film transistor, a storage capacitor, a gate line, a data line, and a power line, but it may vary in various forms depending on the design of the display device 100.

The encapsulation layer 124 which covers the pixel unit 123 is disposed on the pixel unit 123. The encapsulation layer 124 closely seals the organic light emitting diode of the pixel unit 123. The encapsulation layer 124 may protect the organic light emitting diode of the pixel unit 123 from moisture, oxygen, and impacts of the outside. The encapsulation layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulation substrate 125 is disposed on the encapsulation layer 124. The encapsulation substrate 125 protects the organic light emitting diode of the pixel unit 123 together with the encapsulation layer 124. The encapsulation substrate 125 may protect the organic light emitting diode of the pixel unit 123 from moisture, oxygen, and impacts of the outside. The encapsulation substrate 125 may be formed of a metal material, which has high corrosion resistance and is easily processed in the form of foil or thin film, such as aluminum (Al), nickel (Ni), chromium (Cr), and an alloy material of iron (Fe) and nickel. Therefore, as the encapsulation substrate 125 is formed of a metal material, the encapsulation substrate 125 may be implemented as an ultra-thin film and have high resistance against external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed to enclose the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulation layer 124 and the encapsulation substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

The back cover 110 is disposed on the encapsulation substrate 125. The back cover 110 is disposed to be adjacent to the encapsulation substrate 125 of the display panel 120 to protect the display panel 120. In order to protect the display panel 120, the back cover 110 may be formed of a material having rigidity.

In the meantime, the back cover 110 may include a plurality of openings 111. The plurality of openings 111 may allow the back cover 110 to have flexibility. The plurality of openings 111 may be flexibly deformed and allow the back cover 110 to be wound around the roller 151 or unwound from the roller 151 together with the display panel 120. A detailed description thereof will be made with reference to FIGS. 8A and 8B.

A second adhesive layer AD2 is disposed between the encapsulation substrate 125 and the back cover 110. The second adhesive layer AD2 may bond the encapsulation substrate 125 and the back cover 110 to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA), but is not limited thereto.

Even though in FIG. 6, it is illustrated that the plurality of openings 111 of the back cover 110 is not filled with the second adhesive layer AD2, the second adhesive layer AD2 may be filled in a portion or all of the plurality of openings 111. If the second adhesive layer AD2 is filled inside the plurality of openings 111 of the back cover 110, a contact area between the second adhesive layer AD2 and the back cover 110 is increased so that a separation phenomenon may be avoided.

Even though not illustrated in FIG. 6, a translucent film may be further disposed on a rear surface of the substrate 121. The translucent film may perform a function of protecting a front surface of the display panel 120 or minimizing the reflection of external light incident onto the display panel 120. For example, the translucent film may be at least one of a polyethyleneterephthalate (PET) film, a cyclo olefin polymer (COP) film, an anti-reflection film, a polarizer film, and a transmittance controllable film, but is not limited thereto.

Hereinafter, the back cover 110 will be described in more detail with reference to FIGS. 7A and 7B.

<Specific Configuration of Back Cover>

Figure 7A:
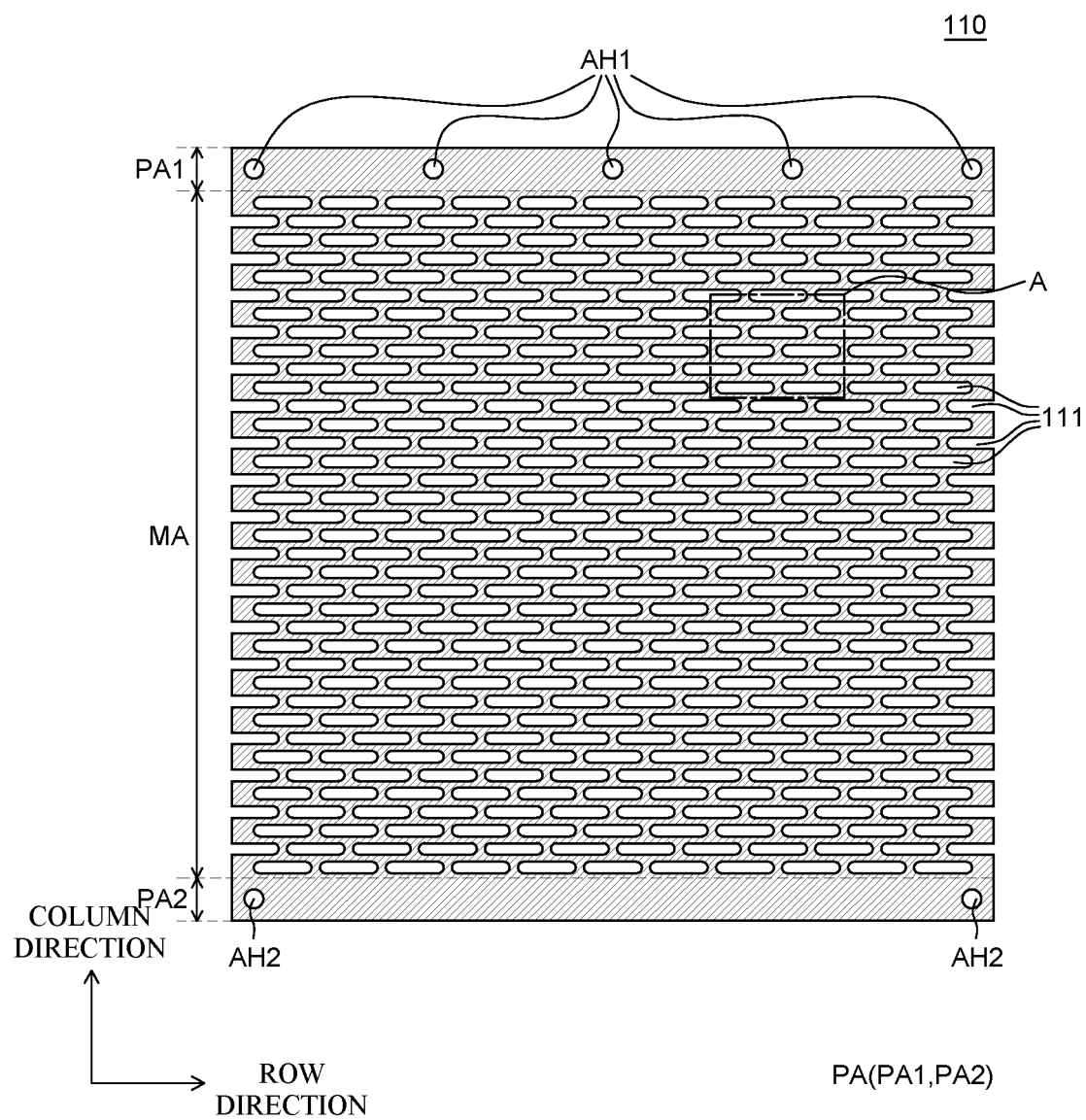
FIG. 7A is a plan view of a back cover of a display device according to an exemplary embodiment of the present disclosure.

FIG. 7A is a plan view of a back cover of a display device according to an exemplary embodiment of the present disclosure. FIG. 7B is an enlarged view of a region A of FIG. 7A.

Referring to FIG. 7A, the back cover 110 includes a support area PA and a malleable area MA. Specifically, the back cover 110 includes a first support area PA1 of an uppermost end of the back cover 110, a second support area PA2 of a lowermost end of the back cover 110, and the malleable area MA between the first support area PA1 and the second support area PA2.

The first support area PA1 of the back cover 110 is an uppermost area of the back cover 110 and is fastened with the head bar 164. The first support area PA1 includes a first fastening hole AH1 to be fastened with the head bar 164. As described in detail with reference to FIG. 3, screws SC which pass through the head bar 164 and the first fastening holes AH1 are disposed to fasten the head bar 164 with the first support area PA1 of the back cover 110. As the first support area PA1 is fastened with the head bar 164, when the link unit 162 which is fastened with the head bar 164 is lifted or lowered, the back cover 110 is also lifted or lowered together with the display panel 120 which is attached to the back cover 110. Even though five first fastening holes AH1 are illustrated in FIG. 7A, the number of first fastening holes AH1 is not limited thereto. Further, even though it is described that the back cover 110 is fastened with the head bar 164 using the first fastening holes AH1 in FIG. 7A, it is not limited thereto and the back cover 110 and the head bar 164 may be fastened with each other without using a separate fastening hole.

The second support area PA2 of the back cover 110 is a lowermost area of the back cover 110 and is fastened with the roller 151. The second support area PA2 may include second fastening holes AH2 to be fastened with the roller 151. For example, screws SC which pass through the roller 151 and the second fastening holes AH2 are disposed to fasten the roller 151 and the second support area PA2 of the back cover 110 with each other. As the second support area PA2 is fastened with the roller 151, the back cover 110 may be wound around or unwound from the roller 151 by the rotation of the roller 151. Even though two second fastening holes AH2 are illustrated in FIG. 7A, the number of second fastening holes AH2 is not limited thereto.

The malleable area MA of the back cover 110 is an area which is wound around or unwound from the roller 151 together with the display panel 120. The malleable area MA may overlap at least the display panel 120 among other configurations of the display unit DP.

A plurality of openings 111 is disposed in the malleable area MA of the back cover 110. When the display unit DP is wound or unwound, the plurality of openings 111 may be deformed by a stress which is applied to the display unit DP. Specifically, when the display unit DP is wound or unwound, the malleable area MA of the back cover 110 may be deformed as the plurality of openings 111 contracts or expands. Further, as the plurality of openings 111 contracts or expands, a slip phenomenon of the display panel 120 disposed on the malleable area MA of the back cover 110 is minimized so that the stress which is applied to the display panel 120 may be minimized.

When the display panel 120 and the back cover 110 are wound, a difference between a length of the display panel 120 which is wound around the roller 151 and a length of the back cover 110 which is wound around the roller 151 may be caused due to the difference of radii of curvature of the display panel 120 and the back cover 110. For example, when the back cover 110 and the display panel 120 are wound around the roller 151, a length of the back cover 110 required for being wound around the roller 151 once may be different from a length of the display panel 120 required for being wound around the roller 151 once. That is, since the back cover 110 is disposed between the roller 151 and the display panel 120, a length of the display panel 120 required to be wound around the roller 151 once may be longer than a length of the back cover 110 required to be wound around the roller 151 once. As described above, the winding lengths of the back cover 110 and the display panel 120 are different from each other due to the difference of radii of curvature at the time of winding the display unit DP, and the display panel 120 attached to the back cover 110 may slide to move from its original position. In this case, a phenomenon that the display panel slides from the back cover 110 due to the stress and the difference of radii of curvature caused by the winding may be defined as a slip phenomenon. When the slip phenomenon is excessively increased, the display panel 120 may be detached from the back cover 110 or failures such as cracks may be caused.

In this case, in the display device 100 according to an exemplary embodiment of the present disclosure, even though the display unit DP is wound or unwound and a stress is applied to the display unit DP, the plurality of openings 111 of the back cover 110 is flexibly deformed to relieve the stress applied to the back cover 110 and the display panel 120. For example, when the back cover 110 and the display panel 120 are wound around the roller 151, a stress which deforms the back cover 110 and the display panel 120 in a vertical direction may be applied. In this case, the plurality of openings 111 of the back cover 110 may extend in a vertical direction of the back cover 110, and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, the plurality of openings 111 is deformed during the process of winding the back cover 110 and the display panel 120 so that a stress which is applied to the display panel 120 from the back cover 110 may also be relieved.

Figure 7B:
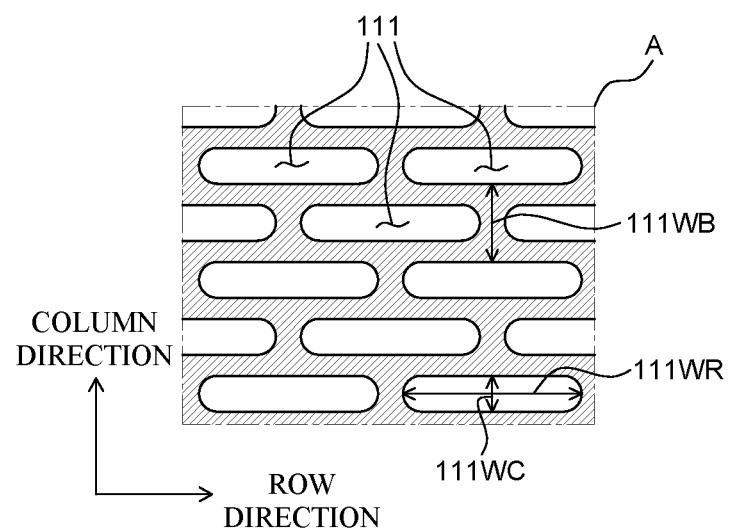
FIG. 7B is an enlarged view of a region A of FIG. 7A according to an exemplary embodiment of the present disclosure.

Referring to FIGS. 7A and 7B, the plurality of openings 111 is disposed to be staggered from a plurality of openings 111 in adjacent rows. For example, a plurality of openings 111 disposed in one row is disposed to be staggered from a plurality of openings 111 disposed in a row adjacent to the row. Specifically, a center of the plurality of openings 111 disposed in an odd-numbered row and a center of the plurality of openings 111 disposed in an even-numbered row are disposed to be staggered and for example, may be staggered by a half of a width 111WR in a row direction of the openings 111. However, the arrangement of the plurality of openings 111 illustrated in FIG. 7A is just an example, and is not limited thereto.

As the plurality of openings 111 is disposed to be staggered, a distance 111WB between a plurality of openings 111 with centers matching in a column direction may be minimized Specifically, an area between the plurality of openings 111 with centers matching in a column direction in the malleable area MA may have rigidity. When the back cover 110 is wound, the back cover 110 needs to be bent in a column direction so that as the distance 111WB of some area between the plurality of openings 111 with centers matching in the column direction becomes longer, it may be difficult for the back cover 110 to be bent in the column direction. In this case, since the plurality of openings 111 is disposed to be staggered in the unit of row, as compared with the case that the openings are not staggered in the unit of row, the distance 111WB between the plurality of openings 111 with centers matching in the column direction may be minimized and the area between the plurality of openings 111 is also minimized. Accordingly, the distance 111WB between the plurality of openings 111 with centers matching in the column direction is reduced and continuously extends in the column direction in the malleable area MA so that an area where the plurality of openings 111 is not disposed is removed. Therefore, the distance 111WB of the area between the plurality of openings 111 having rigidity in the column direction is minimized so that the rigidity of the back cover 110 may be improved without interrupting the winding or unwinding of the back cover 110.

Referring to FIG. 7B, a maximum width 111WR in the row direction is larger than a maximum width 111WC in the column direction in the plurality of openings 111. That is, as illustrated in FIG. 7B, the maximum width 111WR of the plurality of openings 111 in a horizontal direction may be larger than the maximum width 111WC of the plurality of openings 111 in a vertical direction.

As the width 111WR of the plurality of openings 111 in the row direction is increased, the malleable area MA of the back cover 110 may be flexibly deformed. Specifically, when the back cover 110 is wound, the back cover 110 may be bent in the column direction of the back cover 110 and the stress may be applied so that the plurality of openings 111 extends in the column direction. In this case, when the width 111WR of the plurality of openings 111 in the row direction is increased, if the plurality of openings 111 is stretched in the row direction, the width 111WC of the plurality of openings 111 extending in the column direction may be increased. Further, as the plurality of openings 111 extends in the row direction, the stress applied to the malleable area MA may be relieved. Therefore, the malleable area MA of the back cover 110 is easily wound or unwound by increasing the width 111WR of the plurality of openings 111 in the row direction and the stress applied to the malleable area MA may be relieved.

The larger the width 111WC of the plurality of openings 111 in the column direction, the easier the plurality of openings 111 is processed. However, when the width 111WC of the plurality of openings 111 in the column direction is increased, an aperture ratio of the plurality of openings 111 is increased in the malleable area MA and a contact area of the display panel 120 and the back cover 110 which are attached to the malleable area MA is reduced. In this case, when the overlapping area of the display panel 120 and the back cover 110, that is, the contact area between the back cover 110 and the second adhesive layer AD2 is reduced, the back cover 110 and the second adhesive layer AD2 may be separated. Therefore, the adhesiveness may be controlled by adjusting the width 111WC of the plurality of openings 111 in the column direction so that the display panel 120 and the back cover 110 are not separated. Further, the width 111WR of the plurality of openings 111 in the row direction may be adjusted to design the back cover 110 to have high flexibility.

In this case, in the first support area PA1 and the second support area PA2, the plurality of openings 111 as formed in the malleable area MA is not formed. That is, in the first support area PA1 and the second support area PA2, only the first fastening holes AH1 and the second fastening holes AH2 are formed, but the plurality of openings 111 as formed in the malleable area MA is not formed. Further, the first fastening holes AH1 and the second fastening holes AH2 have different shapes from that of the plurality of openings 111. The first support area PA1 and the second support area PA2 which are fixed to the head bar 164 and the roller 151, respectively, need to be more rigid than the malleable area MA. Specifically, as the first support area PA1 and the second support area PA2 have the rigidity, the first support area PA1 and the second support area PA2 may be firmly fixed to the head bar 164 and the roller 151. Therefore, the display unit DP is fixed to the roller 151 and the head bar 164 of the driving unit MP to be moved to the inside or the outside of the housing unit HP in accordance with the operation of the driving unit MP.

In the display device 100 according to an exemplary embodiment of the present disclosure, the back cover 110 with the plurality of openings 111 formed therein is disposed on the rear surface of the display panel 120 to support and protect the display panel 120. The back cover 110 is formed of a metal material to have rigidity and the plurality of openings 111 is formed in the malleable area MA of the back cover 110 where the display panel 120 is disposed so that the flexibility of the back cover 110 may be enhanced. Therefore, in a fully unwound state in which the display unit DP of the display device 100 is disposed outside of the housing unit HP, the back cover 110 which is formed of a rigid material to have high rigidity may support the display panel 120 to be flatly spread. In contrast, in a fully wound state in which the display unit DP of the display device 100 is accommodated in the housing unit HP, the back cover 110 having high flexibility due to the plurality of openings 111 is wound around the roller 151 together with the display panel 120 to be accommodated.

Further, in the display device 100 according to an exemplary embodiment of the present disclosure, the width 111WR of the plurality of openings 111 in the row direction is adjusted so that the back cover 110 has flexibility and thus the stress applied when the back cover 110 is wound may be relieved. Specifically, when the back cover 110 and the display panel 120 are wound around the roller, the back cover 110 may be bent in the column direction and the stress may be applied so that the plurality of openings 111 extends in the column direction. The plurality of openings 111 is formed to have a large width 111WR in the row direction so that when the back cover 110 and the display panel 120 are wound around the roller 151, the plurality of openings 111 may easily be stretched in the column direction and the stress applied to the back cover 110 may be relieved. Therefore, in the display device 100 according to an exemplary embodiment of the present disclosure, the width 111WR of the plurality of openings 111 in the row direction is adjusted to enhance the flexibility of the back cover 110 and the back cover 110 and the display panel 120 may be easily wound around the roller 151. Further, the plurality of openings 111 expands in the column direction to relieve the stress applied to the back cover 110 and the display panel 120 so that the breakage of the display panel 120 may be reduced.

Further, in the display device 100 according to an exemplary embodiment of the present disclosure, the width 111WC of the plurality of openings 111 in the column direction is adjusted to adjust the adhesiveness between the back cover 110 and the display panel 120. Specifically, the display panel 120 is attached to the malleable area MA of the back cover 110. In this case, the larger the aperture ratio of the plurality of openings 111 disposed in the malleable area MA, the smaller the contact area of the display panel 120 and the back cover 110. Therefore, the adhesiveness between the display panel 120 and the back cover 110 may be reduced. However, in the display device 100 according to an exemplary embodiment of the present disclosure, the width 111WC of the plurality of openings 111 of the back cover 110 in the column direction is formed to be small to reduce the aperture ratio of the plurality of openings 111 and increase the contact area of the display panel 120 and the back cover 110. As the contact area of the display panel 120 and the back cover 110 is increased, the adhesiveness of the display panel 120 and the back cover 110 may be enhanced. Further, in the display device 100 according to an exemplary embodiment of the present disclosure, the width 111WC of the plurality of openings 111 in the column direction is adjusted to ensure a predetermined level or higher of the adhesiveness between the back cover 110 and the display panel 120 so that the separation between the back cover 110 and the display panel 120 does not occur.

<Structure of Roller and Control Printed Circuit Board>

Figure 8:
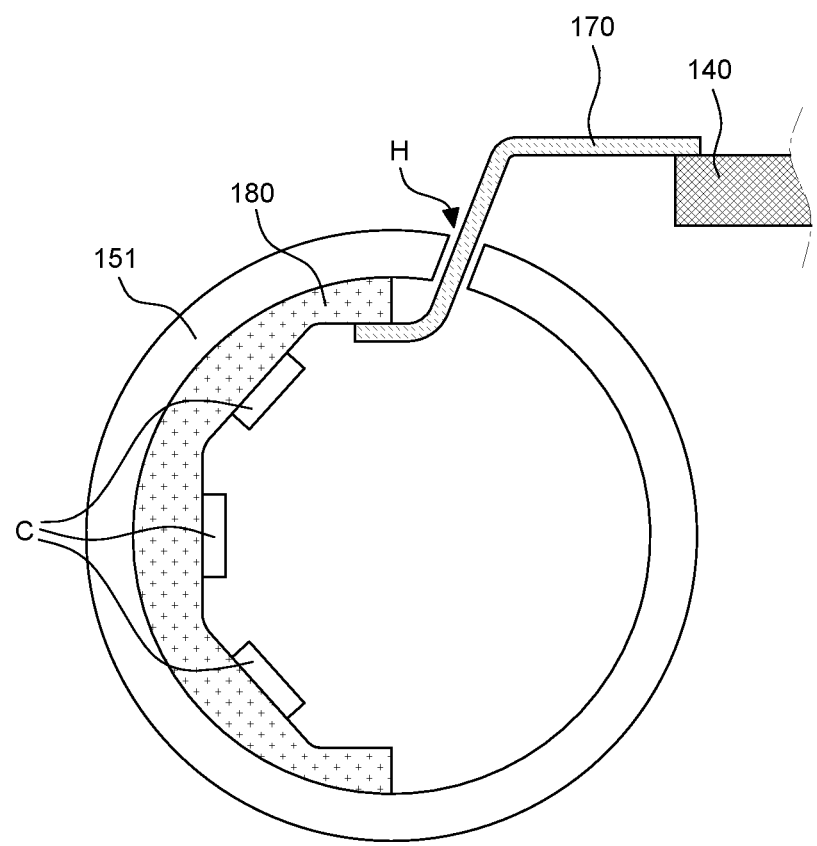
FIG. 8 is a cross-sectional view for explaining a roller and a control printed circuit board of a display device according to an exemplary embodiment of the present disclosure.

FIG. 8 is a cross-sectional view for explaining a roller and a control printed circuit board of a display device according to an exemplary embodiment of the present disclosure. For the convenience of description, in FIG. 8, only a control printed circuit board 180, a roller 151, a flexible cable 170, and a source printed circuit board 140 among various configurations of the display device 100 are schematically illustrated.

Referring to FIG. 8, the control printed circuit board 180 is disposed to be in contact with the roller 151 inside the roller 151 with a shape corresponding to an inner surface of the roller 151. Specifically, an outer surface and an inner surface of the roller 151 have circular shapes and a surface of the control printed circuit board 180 which is in contact with the roller 151, that is, an outer surface of the control printed circuit board 180 may have a circular shape so as to correspond to the inner surface of the roller 151. In other words, the control printed circuit board 180 may have first curved surface having a curvature that matches a curvature of a curved surface of the roller 151. The first curved surface of the control printed circuit board 180 is in contact with the curved surface of the roller 151 in one embodiment. As shown in FIG. 8, the outer surface of the control printed circuit board 180 is in contact with half a circumference of the inner surface of the roller 151 in one embodiment. However, the control printed circuit board 180 may be in contact with more or less of the inner surface of the roller 151 in other embodiments.

Referring to FIG. 8, the inner surface of the control printed circuit board 180 includes a plurality of flat surfaces. As described above, various IC chips C such as a timing controller or a power controller may be mounted in the control printed circuit board 180. However, the IC chips C are formed of a rigid material so that it is not easy to dispose the IC chips C on a curved surface. Therefore, the inner surface of the control printed circuit board 180 may include a plurality of flat surfaces in which various IC chips C are disposed. Even though in FIG. 8, it is illustrated that the inner surface of the control printed circuit board 180 has five flat surfaces, the number of flat surfaces is not limited thereto. Further, when all IC chips C can be mounted in one flat surface, the inner surface of the control printed circuit board 180 may include one flat surface.

Referring to FIG. 8, the inner surface of the control printed circuit board 180 includes a plurality of curved surfaces between the plurality of flat surfaces. As described above, the outer surface of the control printed circuit board 180 is formed to be a curved surface, but the inner surface of the control printed circuit board 180 on which the IC chips C are mounted is formed to be flat. Therefore, a portion which connects adjacent flat surfaces of the inner surface of the control printed circuit board 180 may be formed to be a curved surface. Various wiring lines are disposed in the curved area of the inner surface of the control printed circuit board 180 to connect the IC chips C to each other. In another embodiment, the wiring lines may be disposed in the curved area and the flat surfaces of the control printed circuit board 180 to connect the IC chips C to each other. Even though in FIG. 8, it is illustrated that the inner surface of the control printed circuit board 180 has five flat surfaces so that the curved surfaces are four, the number of curved surfaces is not limited thereto and the number of curved surfaces may be one or two or more depending on the number of flat surfaces.

Referring to FIG. 8, the flexible cable 170 which is connected to the control printed circuit board 180 may be disposed in a hole H disposed in the roller 151. Specifically, the flexible cable 170 is disposed in the roller 151 so as to pass through the hole H to connect the control printed circuit board 180 and the source printed circuit board 140.

The rollable display device is attracting attention in terms of its design. Further, because all the components are accommodated in the housing unit when it is not used so that the entire volume of the rollable display device is reduced to improve the mobility, the rollable display device is also attracting attention. Therefore, when the rollable display device is implemented, it is very important to reduce the size of the housing unit when all components of the rollable display device are accommodated.

In the general rollable display device, the control printed circuit board is disposed in the roller. Further, generally, the printed circuit board is formed to be flat. Since various IC chips mounted in the printed circuit board are formed of a rigid material so that it is difficult to be disposed on the curved surface, generally, the printed circuit board is formed to have a flat shape without having a curved portion. Therefore, the control printed circuit board may also be formed to have a flat shape. Therefore, a diameter of the roller needs to be designed to accommodate the control printed circuit board. However, as the size of the display panel is increased or a resolution of the display panel is increased, the number of IC chips to be used or a size is increased, so that the wiring lines or the circuits to be used may also be increased. Consequently, the size of the control printed circuit board is increased. Therefore, the size of the roller in which the control printed circuit board is disposed and the size of the housing unit are increased so that the design property and the portability of the display device may be degraded. Further, in order to suppress the increase of the size of the roller, a width of the control printed circuit board corresponding to a longitudinal direction of the roller may be increased. However, there is a spatial limit in the roller. Further, when the width of the control printed circuit board is increased, the length of the wiring lines is also increased so that the wiring resistance is increased, and a deviation between signals transmitted through the wiring line may be caused.

Therefore, in the display device 100 according to an exemplary embodiment of the present disclosure, the outer surface of the control printed circuit board 180 is formed to have a shape corresponding to the inner surface of the roller 151. Therefore, even though the size of the control printed circuit board 180 which is disposed in the roller 151 having the same size is increased, the size of the roller 151 may not be increased and the size of the roller 151 may be reduced. Therefore, the design property and the portability of the display device 100 are improved. Specifically, when the outer surface of the control printed circuit board 180 has a curved surface and the inner surface has a plurality of flat surfaces, as compared with the example that the control printed circuit board having a flat shape is disposed in the roller 151 having the same diameter, the surface area of the control printed circuit board 180 in which the IC chips C may be disposed may be increased. Therefore, even though the size of the display panel 120 is increased or the resolution of the display panel 120 is increased, the control printed circuit board 180 may be disposed in the roller 151 without increasing the size of the roller 151. Therefore, the design property and the portability of the display device 100 may be improved.

Further, in the display device 100 according to the exemplary embodiment of the present disclosure, the inner surface of the control printed circuit board 180 has a flat surface so that the reliability of the IC chips C may be improved. Specifically, since the IC chips C have rigidity, it is difficult to dispose the IC chips on the curved surface. Therefore, the inner surface of the control printed circuit board 180 is configured to have a flat surface so that the control printed circuit board 180 with an increased surface area may be implemented without causing a damage of the IC chip C.

In the display device 100 according to the exemplary embodiment of the present disclosure, the control printed circuit board 180 is disposed to be in contact with the roller 151 so that the roller 151 may perform a function of a heat sink which radiates heat generated in the control printed circuit board 180. For example, when the roller 151 is formed of a metal material having a high thermal conductivity, the heat generated in the control printed circuit board 180 may be more effectively radiated through the roller 151. Therefore, in the display device 100 according to the exemplary embodiment of the present disclosure, the reliability of the control printed circuit board 180 may be improved.

<Fixing Structure of Roller and Control Printed Circuit Board>

Figure 9:
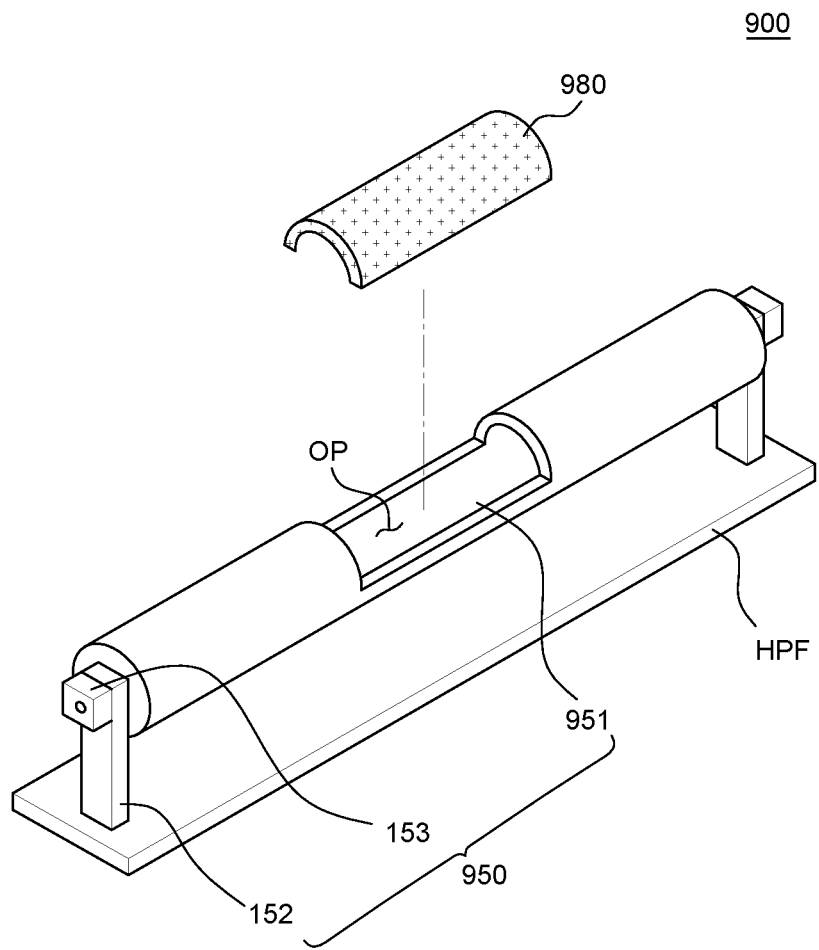
FIG. 9 is an exploded perspective view of a roller unit of a display device according to another exemplary embodiment of the present disclosure.
Figure 10:
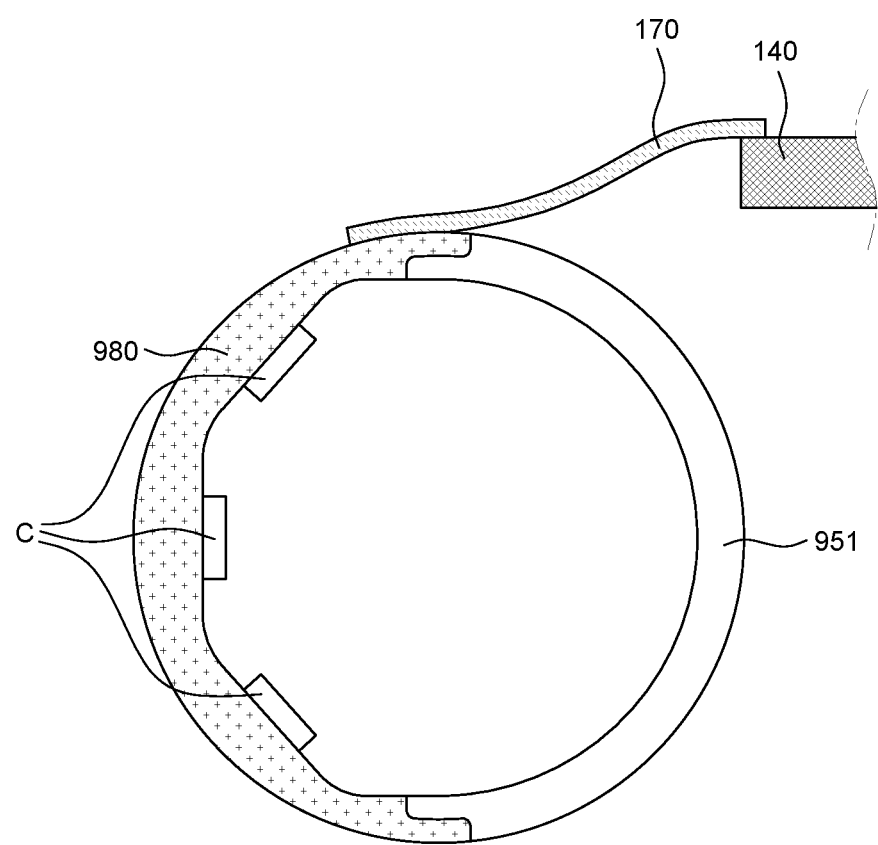
FIG. 10 is a cross-sectional view for explaining a roller and a control printed circuit board of a display device according to another exemplary embodiment of the present disclosure.

FIG. 9 is an exploded perspective view of a roller unit of a display device according to another exemplary embodiment of the present disclosure. FIG. 10 is a cross-sectional view for explaining a roller and a control printed circuit board of a display device according to another exemplary embodiment of the present disclosure. The only difference between a display device 900 of FIGS. 9 and 10 and the display device 100 of FIGS. 1 to 8 is a roller unit 950 and a control printed circuit board 980, but other configurations are substantially the same, so that a redundant description will be omitted. For the convenience of description, in FIG. 9, only the roller unit 950 and the control printed circuit board 980 among various components of the display device 900 are illustrated. In FIG. 10, only the control printed circuit board 980, the roller 951, the flexible cable 170, and the source printed circuit board 140 are schematically illustrated.

Referring to FIGS. 9 and 10, the roller 951 includes an opening OP. The opening OP is disposed in a portion of the roller 951 and the control printed circuit board 980 may be fixed thereto. Specifically, the control printed circuit board 980 is disposed in the opening OP of the roller 951 to be fixed to the roller 951. In this case, the roller 951 and the outer surface of the control printed circuit board 980 may form one cylindrical shape. The control printed circuit board 980 may be fixed (e.g., attached or connected) to the roller 951 using a screw or an adhesive material, but the fixing structure of the control printed circuit board 980 and the roller 951 is not limited thereto. As shown in FIG. 10, at least a portion of the control printed circuit board 980 has a shape that corresponds (e.g., matches) a curved surface of the roller 951. In particular, an outer surface of the control printed circuit board 980 is in contact and aligned with an outer surface of the roller 951 such that the curvature of the outer surface of the control printed circuit board 980 matches the curvature of the outer surface of the roller 951.

The flexible cable 170 is electrically connected to the control printed circuit board 980 on the outer surface of the control printed circuit board 980. That is, the flexible cable 170 is not electrically connected to the control printed circuit board 980 inside the roller 951, but is electrically connected to the control printed circuit board 980 at the outside of the roller 951. However, the present disclosure is not limited thereto and there is a hole in the roller 951 and the flexible cable 170 extends into the roller 951 through the hole to be electrically connected to the control printed circuit board 980 in the roller 951.

In the display device 900 according to another exemplary embodiment of the present disclosure, the control printed circuit board 980 is fixed to the roller 951 and the roller 951 and the control printed circuit board 980 form one cylindrical shape so that heat generated in the control printed circuit board 980 may be effectively radiated. Specifically, when the control printed circuit board 980 is driven, the heat may be generated from the control printed circuit board 980. In this case, the heat generated from the control printed circuit board 980 may degrade the efficiency of the IC chips C disposed in the control printed circuit board 980. Specifically, as the display panel becomes large-sized and a resolution is increased, the integration degree of the IC chips C is increased and the heat radiation problem in the control printed circuit board 980 may become more serious. Therefore, in the display device 900 according to another exemplary embodiment of the present disclosure, the control printed circuit board 980 is disposed to form one cylindrical shape with the roller 951 so that the control printed circuit board 980 is exposed to the outside of the roller 951. Therefore, the heat generated from the control printed circuit board 980 may be effectively radiated and the reliability of the control printed circuit board 980 may be improved.

Further, in the display device 900 according to another exemplary embodiment of the present disclosure, the control printed circuit board 980 is disposed at the outside of the roller 951 so that the structure of the inside of the roller 951 may be more simplified. In the roller 951, a space where various cables to be connected to the control printed circuit board 980, for example, cables connected from the power supply device can be disposed needs to be ensured. In the display device 900 according to another exemplary embodiment of the present disclosure, the control printed circuit board 980 is disposed to form one cylindrical shape with the roller 951, so that a space where various cables can be disposed is ensured in the roller 951 and the structure in the roller 951 may be simplified.

<Plurality of Malleable Areas and Plurality of Support Areas of Back Cover>

Figure 11:
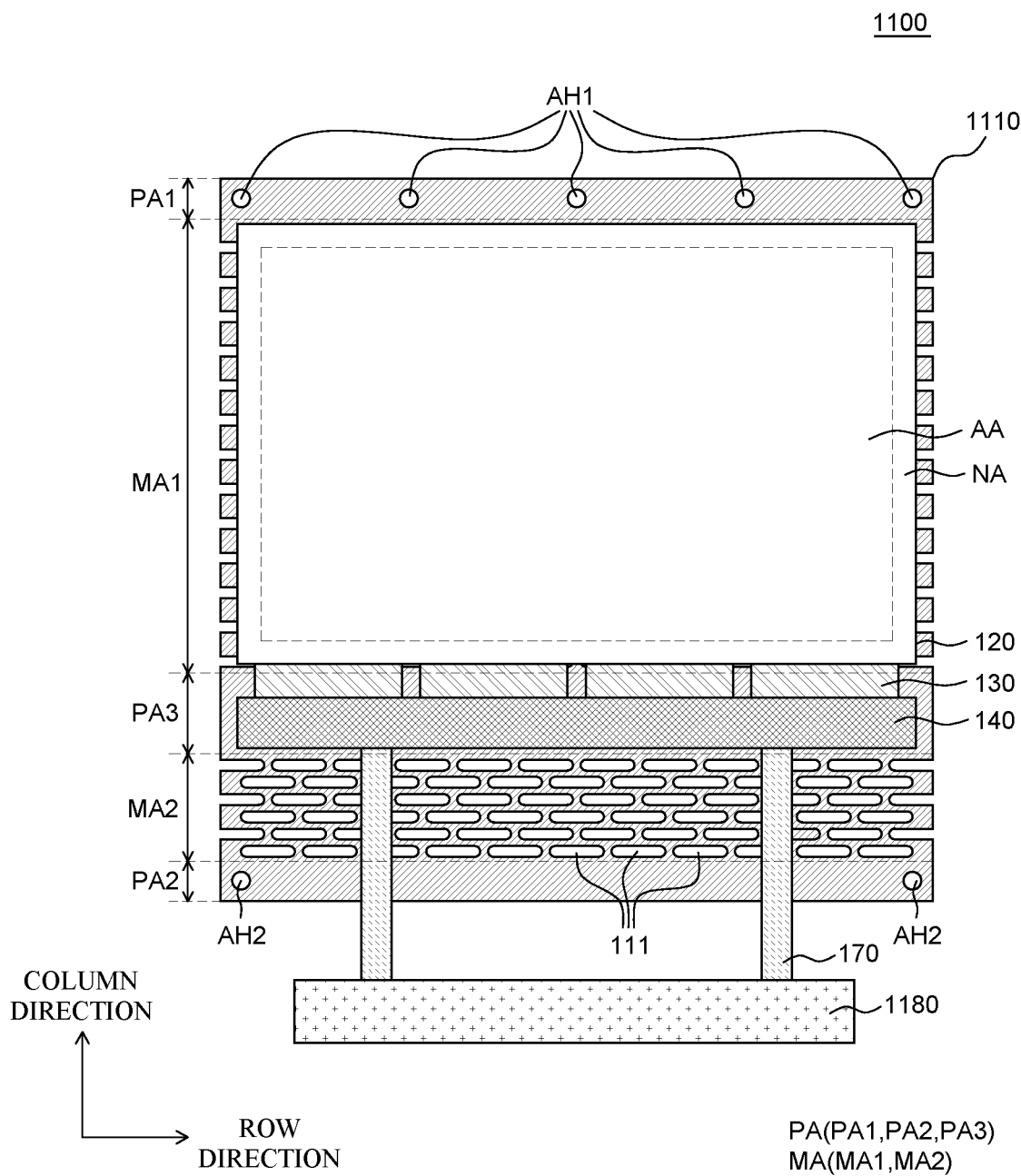
FIG. 11 is a plan view of a display device according to still another exemplary embodiment of the present disclosure.

FIG. 11 is a plan view of a display device according to still another exemplary embodiment of the present disclosure. The only difference between a display device 1100 of FIG. 11 and the display device 100 of FIGS. 1 to 8 is a back cover 1110, but other configurations are substantially the same, so that a redundant description will be omitted. In FIG. 11, for the convenience of description, among various components of the display device 1100, the roller unit 1150 and the lifting unit 160 are not illustrated.

Referring to FIG. 11, the back cover 1110 includes a plurality of support areas PA and a plurality of malleable areas MA. The plurality of support areas PA is areas where a plurality of openings 111 is not disposed and the plurality of malleable areas MA is areas where a plurality of openings 111 is disposed. Specifically, a first support area PA1, a first malleable area MA1, a third support area PA3, a second malleable area MA2, and a second support area PA2 are sequentially disposed from the uppermost end of the back cover 1110.

As described above in detail with reference to FIGS. 1 to 7B, the first support area PA1 is an uppermost area of the back cover 1110. The first support area PA1 is an area which is fastened with the head bar 164 and a first fastening hole AH1 through which a screw SC passes is formed therein to be fastened with the head bar 164.

The first malleable area MA1 is an area extending from the third support area PA3 to a lower side of the back cover 1110. The first malleable area MA1 is an area in which a plurality of openings 111 is disposed and the display panel 120 is attached. Specifically, the remaining portion of the display panel 120 other than the portion of the display panel 120 which is attached to the third support area PA3 is attached to the first malleable area MA1. Therefore, the display panel 120 may be attached to the third support area PA3 and the first malleable area MA1.

When the display unit DP is wound around the roller 1151 to be accommodated in the housing unit HP, the first malleable area MA1 of the back cover 1110 and the lower end portion and a center portion of the display panel 120 which are attached to the first malleable area MA1 may be wound around the roller 1151. In this case, in the first malleable area MA1 of the back cover 1110, the plurality of openings 111 is formed so that the first malleable area MA1 may have high flexibility and may be easily wound around the roller 1151 together with the display panel 120. The first malleable area MA1 may perform the substantially same function as the malleable area MA which has been described with reference to FIGS. 1 to 7B.

The third support area PA3 is an area extending from the first malleable area MA1 to a lower side of the back cover 1110. A flexible film 130 which is connected to one end of the display panel 120 and a source printed circuit board 140 are attached to the third support area PA3.

In order to protect the flexible film 130 and the source printed circuit board 140, the third support area PA3 may allow the flexible film 130 and the source printed circuit board 140 to be wound around the roller 1151 in a flat shape, rather than a curved shape. Further, a portion of the roller 1151 may be formed to be flat, corresponding to the third support area PA3. A detailed description thereof will be made below with reference to FIGS. 13A to 13C.

The second malleable area MA2 is an area extending from the third support area PA3 to a lower side of the back cover 1110. In the second malleable area MA2, a portion of the flexible cable 170 connected to the source printed circuit board 140 of the third support area PA3 is disposed. Further, a plurality of openings 111 is disposed in the second malleable area MA2.

The second malleable area MA2 is an area which extends to dispose the display area AA of the display panel 120 at the outside of the housing unit HP. For example, when the back cover 1110 and the display panel 120 are fully unwound, the second support area PA2 of the back cover 1110 which is fixed to the roller 1151 to the third support area PA3 to which the flexible film 130 and the source printed circuit board 140 are attached may be disposed in the housing unit HP. The first malleable area MA1 and the third support area PA3 to which the display panel 120 is attached may be disposed at the outside of the housing unit HP. In this case, when a length from the second support area PA2 fixed to the roller 1151 to the second malleable area MA2 and the third support area PA3 is smaller than a length from the second support area PA2 to the opening HPO of the housing unit HP, a portion of the first malleable area MA1 to which the display panel 120 is attached may be disposed in the housing unit HP. Therefore, since a portion of the lower end of the display area AA of the display panel 120 is disposed in the housing unit HP, it may be difficult to watch images. Therefore, the length from the second support area PA2 fixed to the roller 1151 to the second malleable area MA2 and the third support area PA3 may be designed to be equal to the length from the second support area PA2 fixed to the roller 1151 to the opening HPO of the housing unit HP.

The second support area PA2 is an area extending from the second malleable area MA2 to the lower side of the back cover 1110. As described above in detail with reference to FIGS. 1 to 7B, the second support area PA2 is a lowermost area of the back cover 1110. The second support area PA2 is fastened with the roller 1151 and has second fastening holes AH2 to be fastened with the roller 1151.

<Control Printed Circuit Board Disposed in D Shaped Roller>

Figure 12:
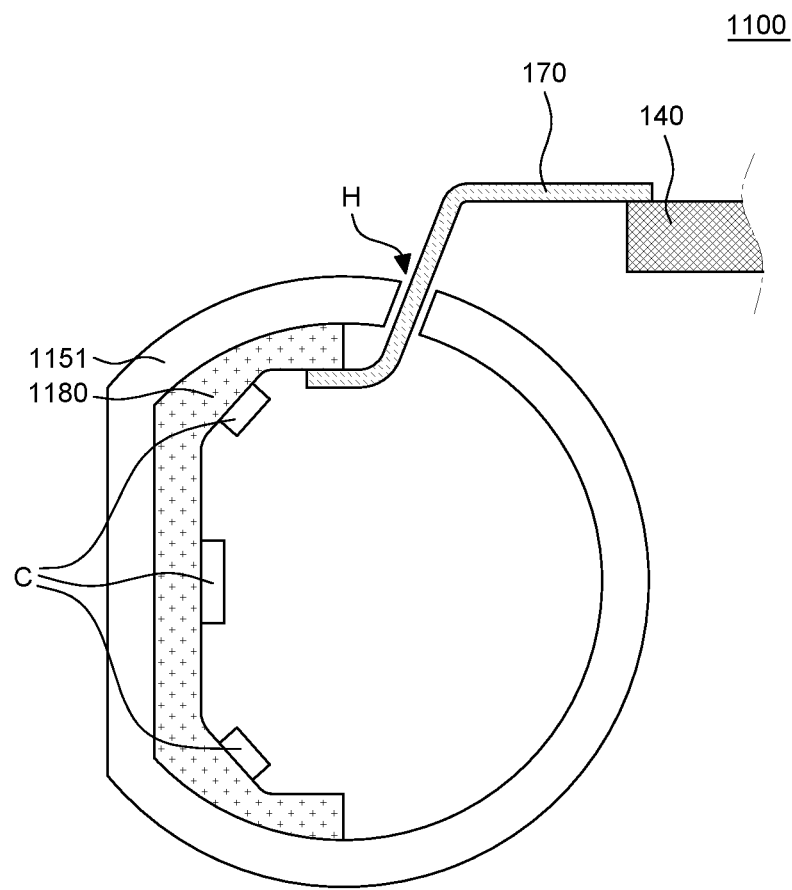
FIG. 12 is a cross-sectional view for explaining a roller and a control printed circuit board of a display device according to another exemplary embodiment of the present disclosure.

FIG. 12 is a cross-sectional view for explaining a roller and a control printed circuit board of a display device according to another exemplary embodiment of the present disclosure. For the convenience of description, in FIG. 12, only a roller 1151, a control printed circuit board 1180, a flexible cable 170, and a source printed circuit board 140 among various configurations of the display device 1100 are illustrated.

Referring to FIG. 12, the roller 1151 includes a flat portion and a curved portion. The control printed circuit board 1180 is disposed in the roller 1151 with a shape corresponding to the inner surface of the roller 1151. That is, a portion of the outer surface of the control printed circuit board 1180 corresponding to the flat portion of the roller 1151 is a flat surface and a portion corresponding to the curved portion of the roller 1151 is a curved surface.

Referring to FIG. 12, the inner surface of the control printed circuit board 1180 includes a plurality of flat surfaces and includes a plurality of curved surfaces between the plurality of flat surfaces. Further, one or more IC chips C are mounted on the flat surface of the control printed circuit board 1180 and a wiring line which connects the IC chips C may be disposed on the curved surface of the control printed circuit board 1180.

Referring to FIG. 12, the flexible cable 170 which is connected to the control printed circuit board 1180 may be disposed in a hole H disposed in the roller 1151. Specifically, the flexible cable 170 is disposed in the roller 1151 so as to pass through the hole H to connect the control printed circuit board 1180 and the source printed circuit board 140.

<Winding Process of Display Device>

Figure 13A:
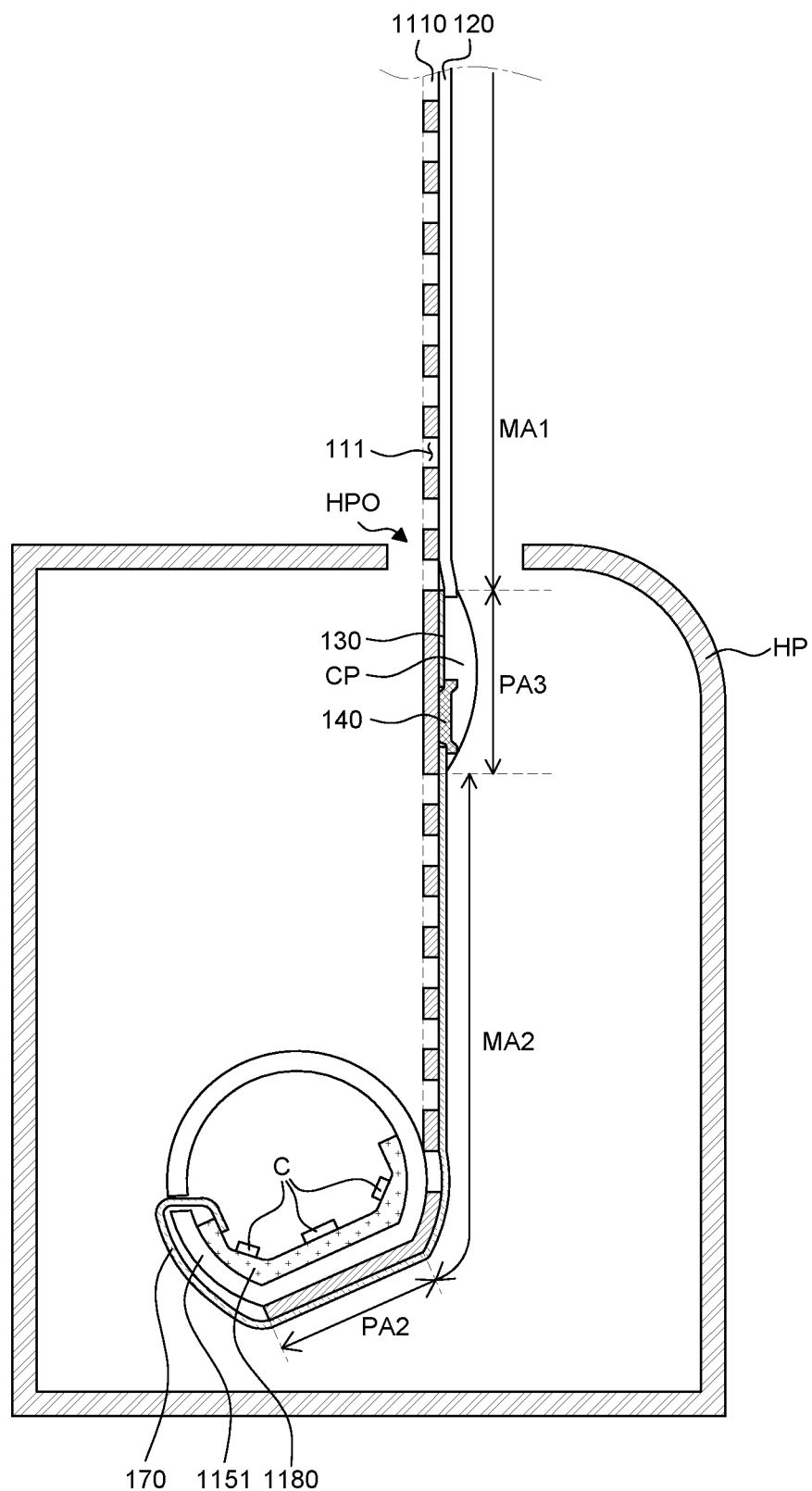
FIGS. 13A to 13C are cross-sectional views of a display device according to another exemplary embodiment of the present disclosure.
Figure 13B:
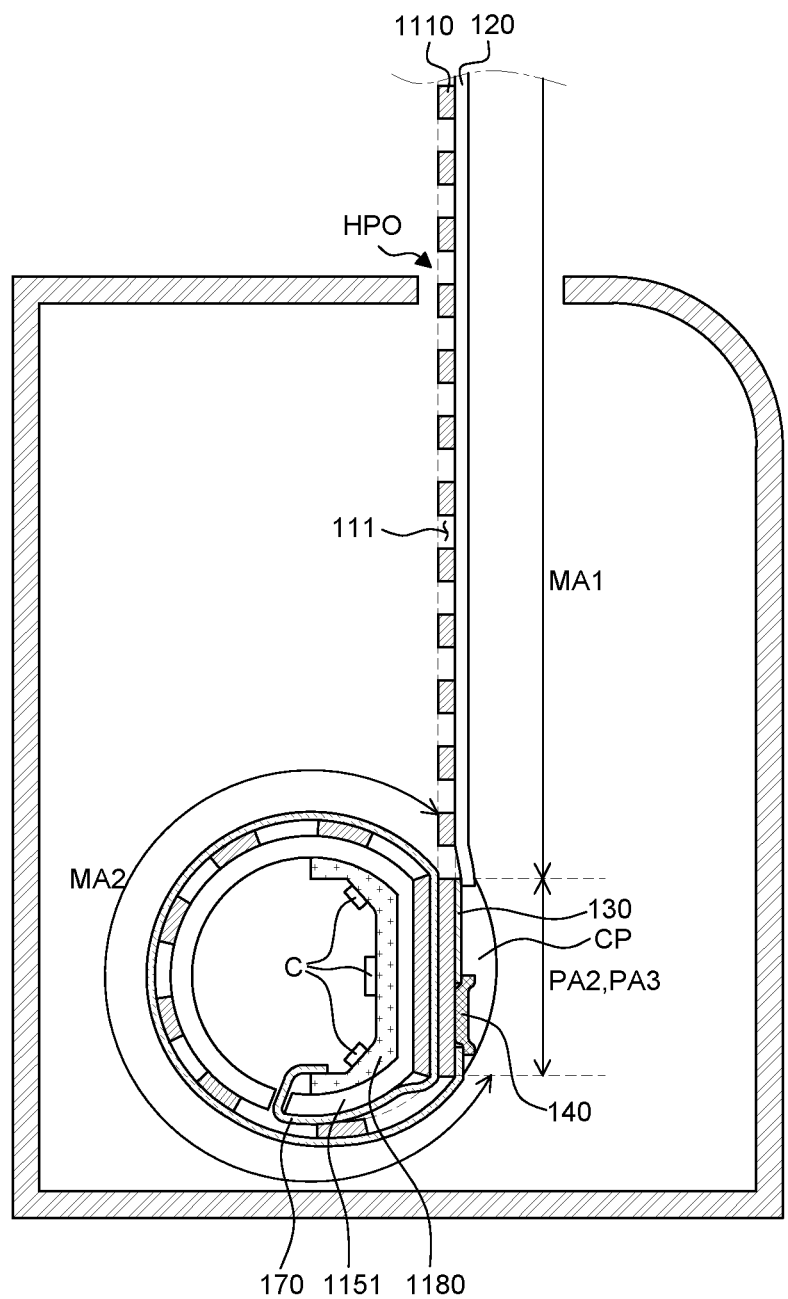
Figure 13C:
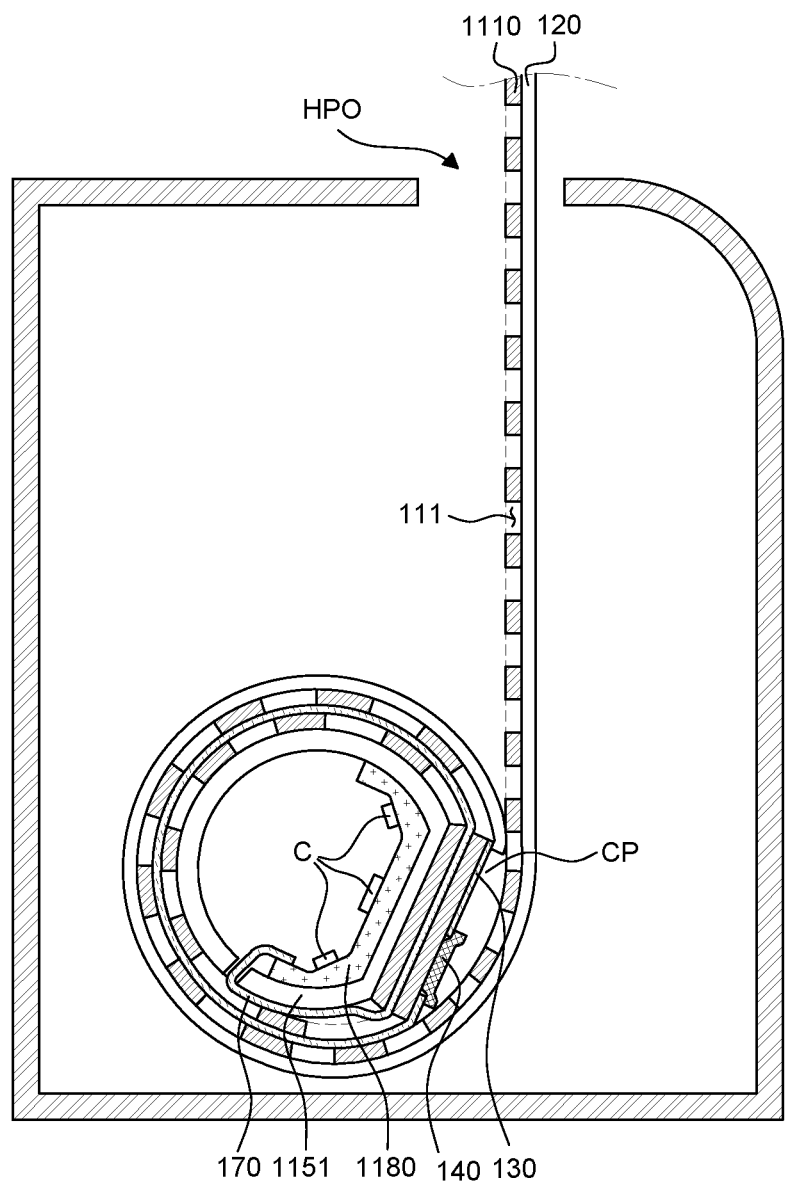

FIGS. 13A to 13C are cross-sectional views of a display device according to another exemplary embodiment of the present disclosure. FIG. 13A is a cross-sectional view in a state in which the back cover 1110 is fully unwound from the roller 1151. FIG. 13B is a cross-sectional view in a state in which the second support area PA2, the second malleable area MA2, and the third support area PA3 of the back cover 1110 are wound around the roller 1151. FIG. 13C is a cross-sectional view in a state in which the second support area PA2, the second malleable area MA2, the third support area PA3, and the first malleable area MA1 of the back cover 1110 are wound around the roller 1151.

Referring to FIG. 13A, the roller 1151 is entirely cylindrical, but a portion thereof may be flat. That is, a portion of an outer circumferential surface of the roller 1151 is formed to be flat and the remaining portion of the outer circumferential surface is formed to be curved.

The second support area PA2 of the back cover 1110 is fastened with the flat portion of the roller 1151. Except for the second support area PA2 fastened with the roller 1151, the remaining portion of the back cover 1110 disposed in an area extending from the second support area PA2 may be flat.

The control printed circuit board 1180 is disposed in the roller 1151 and the flexible cable 170 connected to one end of the control printed circuit board 1180 passes through the hole H of the roller 1151 so that the other end is connected to the source printed circuit board 140. Specifically, a portion of the flexible cable 170 is disposed in the roller 1151 and the other portion is disposed at the outside of the roller 1151.

A cover unit CP is further disposed on the flexible film 130 and the source printed circuit board 140 disposed in the third support area PA3. The cover unit CP is disposed so as to cover the flexible film 130 and the source printed circuit board 140 and formed to have a convex shape. The cover unit CP may protect the source printed circuit board 140 and the flexible film 130 and may be formed of an insulating material such as resin, but is not limited thereto. Further, a component which protects the flexible film 130 and the source printed circuit board 140 and fixes the flexible film 130 and the source printed circuit board 140 to the back cover 1110 is not limited to the cover unit CP, and various mechanical components may be used.

In the meantime, when the back cover 1110 is fully unwound, the second malleable area MA2 and the third support area PA3 of the back cover 1110 are disposed in the housing unit HP and the first malleable area MA1 of the back cover 1110 may be disposed at the outside of the housing unit HP.

Next, referring to FIG. 13B, the flexible cable 170 disposed in the second support area PA2 and the second malleable area MA2 and the second support area PA2, the second malleable area MA2, and the third support area PA3 of the back cover 1110 are wound around the roller 1151. The first malleable area MA1 extending from the third support area PA3 of the back cover 1110 is unwound.

The second support area PA2 and the third support area PA3 of the back cover 1110 are disposed in the flat portion of the outer circumferential surface of the roller 1151 and the second malleable area MA2 of the back cover 1110 is disposed in the curved portion.

The third support area PA3 in which the source printed circuit board 140 and the flexible film 130 are disposed is wound to the flat portion of the roller 1151 so that the third support area PA3 and the source printed circuit board 140 and the flexible film 130 of the third support area PA3 maintain a flat state without being bent. Therefore, the flexible film 130 and the source printed circuit board 140 always maintain a flat state regardless of the winding or unwinding of the display unit DP and the damage caused when the flexible film 130 and the source printed circuit board 140 are bent may be suppressed.

Next, referring to FIG. 13C, the flexible cable 170 disposed in the second support area PA2 and the second malleable area MA2 and the second support area PA2, the second malleable area MA2, and the third support area PA3 of the back cover 1110 are wound around the roller 1151. A portion of the first malleable area MA1 of the back cover 1110 is further wound.

The portion of the first malleable area MA1 of the back cover 1110 may be wound to overlap a curved portion of the roller 1151. That is, the portion of the back cover 1110 of the first malleable area MA1 which is wound on the second malleable area MA2 wound in the curved portion of the roller 1151 may be bent along the curved shape of the roller 1151.

The other portion of the first malleable area MA1 of the back cover 1110 may be wound to overlap a flat portion of the roller 1151. The other portion of the back cover 1110 of the first malleable area MA1 wound on the second support area PA2 and the third support area PA3 wound in the flat portion of the roller 1151 may be bent like the portion of the back cover 1110 of the first malleable area MA1.

Specifically, the first malleable area MA1 may be wound around the roller 1151 so as to cover the third support area PA3. In this case, the cover unit CP may be disposed between the first malleable area MA1 and the third support area PA3. Therefore, the first malleable area MA1 may be wound to cover the cover unit CP of the third support area PA3 and be bent along the shape of the cover unit CP. The cover unit CP has a curved surface so that the first malleable area MA1 may also be bent along the curved surface. Specifically, the curved shape of an upper surface of the cover unit CP has a shape corresponding to the roller 1151, so that a cross-section of the first malleable area MA1 of the back cover 1110 wound around the roller 1151 may have a substantially circular shape.

In the display device 1100 according to another exemplary embodiment of the present disclosure, the third support area PA3 always maintains a flat state so that the damage of the flexible film 130 and the source printed circuit board 140 which are attached to the third support area PA3 may be minimized. The third support area PA3 is an area to which the flexible film 130 and the source printed circuit board 140 are attached and always maintains a flat state. Specifically, when the back cover 1110 is wound around the roller 1151, the back cover 1110 is wound while being bent along the shape of the roller 1151. Therefore, in the display device 1100 according to another exemplary embodiment of the present disclosure, a portion of the roller 1151 around which the third support area PA3 of the back cover 1110 is wound is formed to be flat surfaces so that the third support area PA3 of the back cover 1110 may be flatly wound around the roller 1151. Even though the third support area PA3 of the back cover 1110 is wound around the roller 1151, the third support area PA3 of the back cover 1110 may always maintain a flat state, so that the flexible film 130 and the source printed circuit board 140 attached to the third support area PA3 also maintain a flat state. For example, when the display unit DP is fully unwound, the flexible film 130 and the source printed circuit board 140 may maintain the flat state by the third support area PA3 having high rigidity. In contrast, when the display unit DP is fully wound, the flexible film 130 and the source printed circuit board 140 are seated in a flat portion of the roller 1151 to maintain the flat state. Therefore, in the display device 1110 according to another exemplary embodiment of the present disclosure, the flexible film 130 and the source printed circuit board 140 are not repeatedly bent so that the damage of the flexible film 130 and the source printed circuit board 140 may be minimized.

<Roller and Control Printed Circuit Board which Form D Shape>

Figure 14:
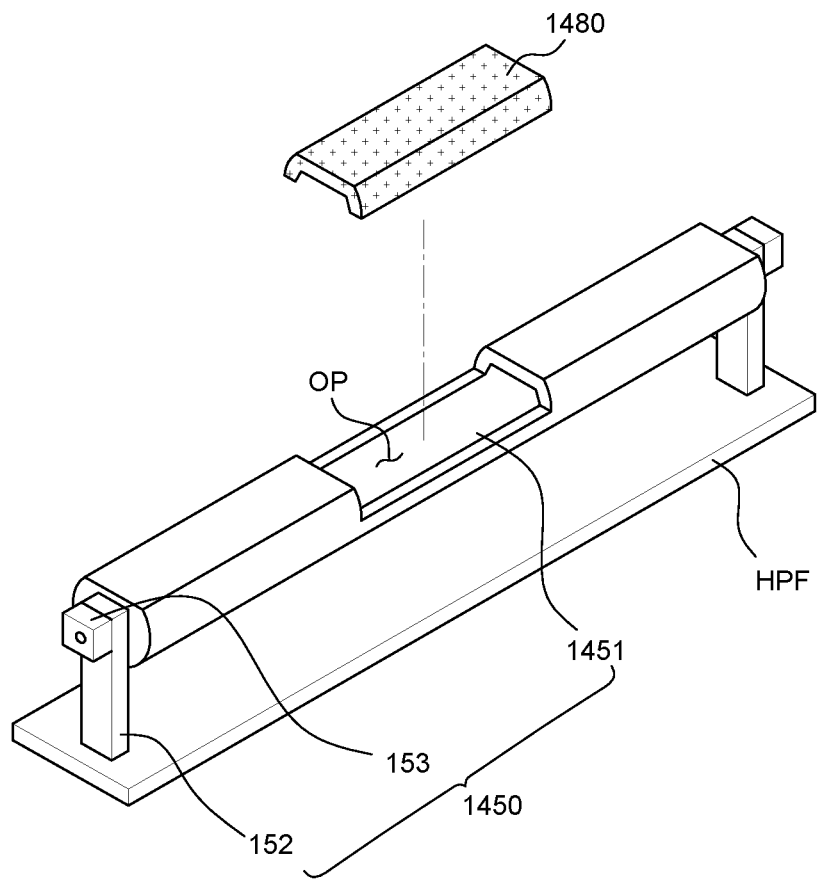
FIG. 14 is an exploded perspective view of a roller unit of a display device according to another exemplary embodiment of the present disclosure.
Figure 15:
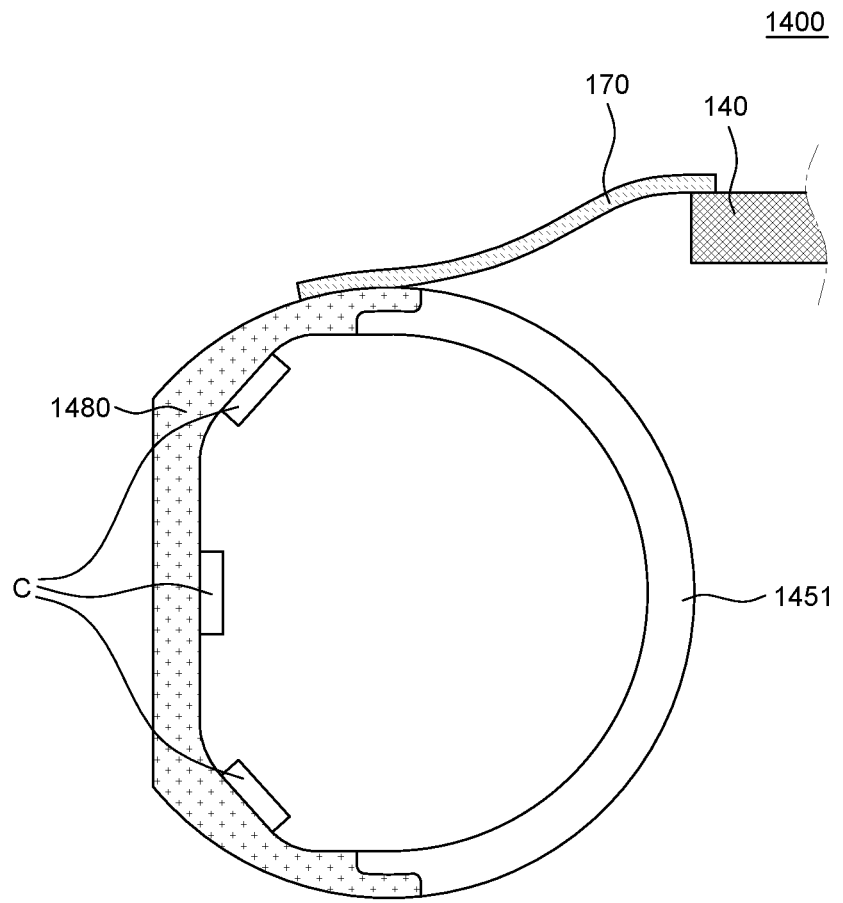
FIG. 15 is a cross-sectional view for explaining a roller and a control printed circuit board of a display device according to another exemplary embodiment of the present disclosure.

FIG. 14 is an exploded perspective view of a roller unit of a display device according to another exemplary embodiment of the present disclosure. FIG. 15 is a cross-sectional view for explaining a roller and a control printed circuit board of a display device according to another exemplary embodiment of the present disclosure. The only difference between a display device 1400 of FIGS. 14 and 15 and the display device 900 of FIGS. 9 and 10 is a roller unit 1450 and a control printed circuit board 1480, but other configurations are substantially the same, so that a redundant description will be omitted. For the convenience of description, in FIG. 14, only the roller unit 1450 and the control printed circuit board 1480 among various components of the display device 1400 are illustrated. In FIG. 15, only the control printed circuit board 1480, the roller 1451, the flexible cable 170, and the source printed circuit board 140 are schematically illustrated.

Referring to FIGS. 14 and 15, the roller 1451 includes an opening OP. The opening OP is disposed in a portion of the roller 1451 and the control printed circuit board 1480 may be fixed thereto. Specifically, the control printed circuit board 1480 is disposed in the opening OP of the roller 1451 to be fixed to the roller 1451.

Referring to FIGS. 14 and 15, the control printed circuit board 1480 includes a flat portion and curved portions at both sides of the flat portion. Therefore, the roller 1451 includes a flat portion corresponding to the flat portion of the control printed circuit board 1480 so that when the control printed circuit board 1480 is fixed to the roller 1451, a cross-section may form a D shape.

Referring to FIG. 15, the flexible cable 170 is electrically connected to the control printed circuit board 1480 on the outer surface of the control printed circuit board 1480. However, the present disclosure is not limited thereto and there is a hole in the roller 1451 and the flexible cable 170 extends into the roller 1451 through the hole to be electrically connected to the control printed circuit board 1480 in the roller 1451.

In the display device 1400 according to another exemplary embodiment of the present disclosure, the control printed circuit board 1480 is disposed in the opening OP of the roller 1451 so that the roller 1451 and the control printed circuit board 1480 form one D shape. Therefore, heat generated in the control printed circuit board 1480 may be effectively radiated.

Further, in the display device 1400 according to another exemplary embodiment of the present disclosure, since the control printed circuit board 1480 is disposed at the outside of the roller 1451, the structure in the roller 1451 may be further simplified and a space where various cables can be disposed may be ensured in the roller 1451.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A rollable display device comprising:
    a rollable display panel including a plurality of pixels;
    a roller comprising an outer surface and an inner surface, the roller configured to roll the rollable display panel around the outer surface of the roller into a rolled state, and unroll the rollable display panel from the rolled state to an unrolled state; and
    a first printed circuit board electrically connected to the rollable display panel,
    wherein the first printed circuit board comprises a first curved surface having a curvature that matches a curvature of a curved surface of the roller, wherein the first curved surface of the printed circuit board is in contact with the curved surface of the roller.

2. The rollable display device of claim 1, wherein the first printed circuit board is housed within the roller and the curved surface of the roller is an inner surface of the roller, wherein the first curved surface of the first printed circuit board is in contact with the inner surface of the roller.

3. The rollable display device of claim 2, wherein the roller comprises a circular shape and the first curved surface of the first printed circuit board is in contact with half a circumference of the inner surface of the roller.

4. The rollable display device of claim 2, wherein the first printed circuit board includes a plurality of flat surfaces that do not contact the inner surface of the roller and a plurality of second curved surfaces that do not contact the inner surface of the roller, wherein each of the plurality of second curved surfaces connects together a pair of flat surfaces from the plurality of flat surfaces.

5. The rollable display device of claim 4, further comprising:
    a plurality of integrated circuit chips, each integrated circuit chip disposed on a corresponding one of the plurality of flat surfaces of the first printed circuit board.

6. The rollable display device of claim 5, wherein the first printed circuit board further includes wiring lines that electrically connect together the plurality of integrated circuit chips, the wiring lines disposed in the plurality of second surfaces of the first printed circuit board.

7. The rollable display device of claim 2, further comprising:
    a flexible cable having a first end and a second end, the first end of the flexible cable connected to the first printed circuit board through a hole in the roller; and
    a second printed circuit board connected to the second end of the flexible cable outside of the roller.

8. The rollable display device of claim 7, wherein the inner surface of the roller comprises a flat portion and a curved portion having the curvature of the inner surface of the roller, wherein the first printed circuit board further comprises a flat surface that is in contact with the flat portion of the roller, the flat surface of the first printed circuit board extending from the first curved surface of the first printed circuit board.

9. The rollable display device of claim 8, wherein the flexible cable and the second printed circuit board overlaps the flat portion of the inner surface of the roller but not the curved portion of the inner surface of the roller in the rolled state of the rollable display panel.

10. The rollable display device of claim 1, wherein the first curved surface of the first printed circuit board is an outer surface of the first printed circuit board and the curved surface of the roller is an outer surface of the roller, wherein the outer surface of the first printed circuit board is in contact and aligned with the outer surface of the roller such that the curvature of the outer surface of the first printed circuit board matches the curvature of the outer surface of the roller.

11. The rollable display device of claim 10, wherein the roller and the first printed circuit board form a cylinder.

12. The rollable display device of claim 10, wherein the first printed circuit board includes an inner surface that is in contact with and aligned with an inner surface of the roller.

13. The rollable display device of claim 12, wherein the inner surface of the roller is entirely curved and wherein the inner surface of the first printed circuit board comprises a plurality of flat surfaces and a plurality of curved surfaces, wherein each of the plurality of curved surfaces connects together a pair of flat surfaces from the plurality of flat surfaces.

14. The rollable display device of claim 13, further comprising:
    a plurality of integrated circuit chips, each integrated circuit chip disposed on a corresponding one of the plurality of flat surfaces of the first printed circuit board.

15. The rollable display device of claim 14, wherein the first printed circuit board further includes wiring lines that electrically connect together the plurality of integrated circuit chips, the wiring lines disposed in the plurality of curved surfaces of the first printed circuit board.

16. The rollable display device of claim 10, further comprising:
    a flexible cable having a first end and a second end, the first end connected to the outer surface of the first printed circuit board; and
    a second printed circuit board connected to the second end of the flexible cable.

17. The rollable display device of claim 16, wherein the outer surface of the first printed circuit board includes a flat surface that extends from a portion of the outer surface of the first printed circuit board having the curvature.

18. The rollable display device of claim 17, wherein the flexible cable and the second printed circuit board overlaps the flat surface of the printed circuit board but not the portion of the outer surface of the first printed circuit board having the curvature in the rolled state of the rollable display panel.

* * * * *